United States Patent [19]

Abele

[11] Patent Number: 5,162,771
[45] Date of Patent: Nov. 10, 1992

[54] HIGHLY EFFICIENT YOKED PERMANENT MAGNET

[75] Inventor: Manlio G. Abele, New York, N.Y.

[73] Assignee: New York University, New York, N.Y.

[21] Appl. No.: 707,620

[22] Filed: May 30, 1991

Related U.S. Application Data

[63] Continuation-in-part of Ser. No. 591,458, Oct. 1, 1990, abandoned.

[51] Int. Cl.⁵ .............................................. H01F 7/02
[52] U.S. Cl. ..................................... 335/306; 335/304
[58] Field of Search ............... 335/210, 214, 296, 302, 335/301, 304, 306; 315/5.35; 324/318, 319, 320

[56] References Cited

U.S. PATENT DOCUMENTS 3,227,931  1/1966  Adler ................................... 335/306

*Primary Examiner*—Leo P. Picard
*Assistant Examiner*—Ramon M. Barrera
*Attorney, Agent, or Firm*—Rosen, Dainow & Jacobs

[57] ABSTRACT

A yoked magnetic structure has a pair of spaced magnetized members defining a cavity, and an end ferromagnetic structure closing said cavity and abutting an end of the magnetized members. The end structure comprising at least a first element of triangular cross section having one side abutting an end of one of said magnetized member and a second element of triangular cross section having one side abutting the adjacent side of said cavity. The first and second elements have second sides away from the magnetized member and cavity defining at least part of an equipotential line whereby the flux density on the side of the equipotential line away from the magnetized structure is zero. A region of $\mu = \infty$ material is provided adjacent the magnetized member to minimize the effect of perturbations.

18 Claims, 19 Drawing Sheets

HIGHLY EFFICIENT YOKED PERMANENT MAGNET

PRIOR APPLICATIONS

This application is a continuation-in-part of application Ser No. 591,458 filed Oct. 1, 1990, and now abandoned.

FIELD OF THE INVENTION

This invention relates to yoked permanent magnets that have improved efficiency. Such magnets may be employed, for example only, in NMR equipment.

BACKGROUND OF THE INVENTION

In view of the large volumes of magnetic materials employed in the development of uniform magnetic fields, and the high cost of such magnetic materials, it is desirable to provide magnetic structures that have improved efficiency.

Magnetic structure designs for this purpose have been described, for example, in my copending U.S. patent application Ser. No. 424,162 filed Oct. 19, 1989, Abele, assigned to the applicant of the present application, and in my publication "Optimum Design of Two-Dimensional Permanent Magnets", T.R.-21, NYU Medical Center, NYU School of Medicine, Oct. 15, 1989, and I incorporate both of these disclosures herein by reference.

I refer to U.S. Pat. No. 4,647,887, herein for comparative purposes, in order that the differences in theory and operation of my invention, and the cladding arrangement of this citation can be more clearly appreciated.

I also refer herein to U S. Pat. No. 4,679,022, Miyamoto et al, as an example of a system employing shaping poles of known type, similar to those described with reference to FIG. 11, in order to enable a clearer appreciation of the differences between my invention and magnetic systems employing shaping poles.

SUMMARY OF THE INVENTION

Briefly stated, the invention provides a yoked magnetic structure having a pair of spaced magnetized members and defining a cavity, and an end ferromagnetic structure closing said cavity and abutting an end of said magnetized members. The end structure comprises at least a first element of triangular cross section having one side abutting an end of one of said magnetized members and having a permeability $\mu_0$ and a second element of triangular cross section having one side abutting the adjacent side of said cavity. The first and second elements have second sides away from the magnetized member and cavity defining at least part of an equipotential line whereby the flux density on the side of the equipotential line away from the magnetized structure is zero.

In accordance with a further feature of the invention, a yoked magnetic structure may be further provided with a structure of a ferromagnetic material and magnetized material positioned at an end of the cavity that permits access to the cavity while minimizing any inhomogeneity of the field in the cavity.

BRIEF DESCRIPTION OF THE DRAWING

In order that the invention may be more clearly understood, it will now be disclosed in greater detail with reference to the accompanying drawing, wherein.

DETAILED DISCLOSURE OF THE INVENTION

The figure of merit M of a magnetic structure having a cavity is defined by the equation:

$$M = K^2 \frac{A_c}{A_m} \quad (1)$$

where $A_c$ and $A_m$ are the cross sectional areas of the cavity of of the magnetic material, respectively, and K is a parameter defined as:

$$K = \mu_0 \frac{H_0}{J_1} \quad (2)$$

where $H_0$ is the magnitude of intensity $\bar{H}_0$ within the cavity and $J_1$ is the uniform remanence in the magnetic material.

In order to generate the field $H_0$, a thickness of the material is necessary as defined by the relationship:

$$\frac{y_1 - y_0}{y_0} = \frac{K}{1 - K} \quad (3)$$

Ideally, in order to close the circuit, it would be desirable to employ a material of infinite magnetic permeability. If $\mu$ is very large but not exactly infinity, the flux lines will bend to be very close to the surface $u_1$, and when $\mu = \infty$, the flux lines at the surface $u_1$ collapse to the surface, which corresponds to the interface between the "yoke" and the magnetized material 10.

Figure 1:
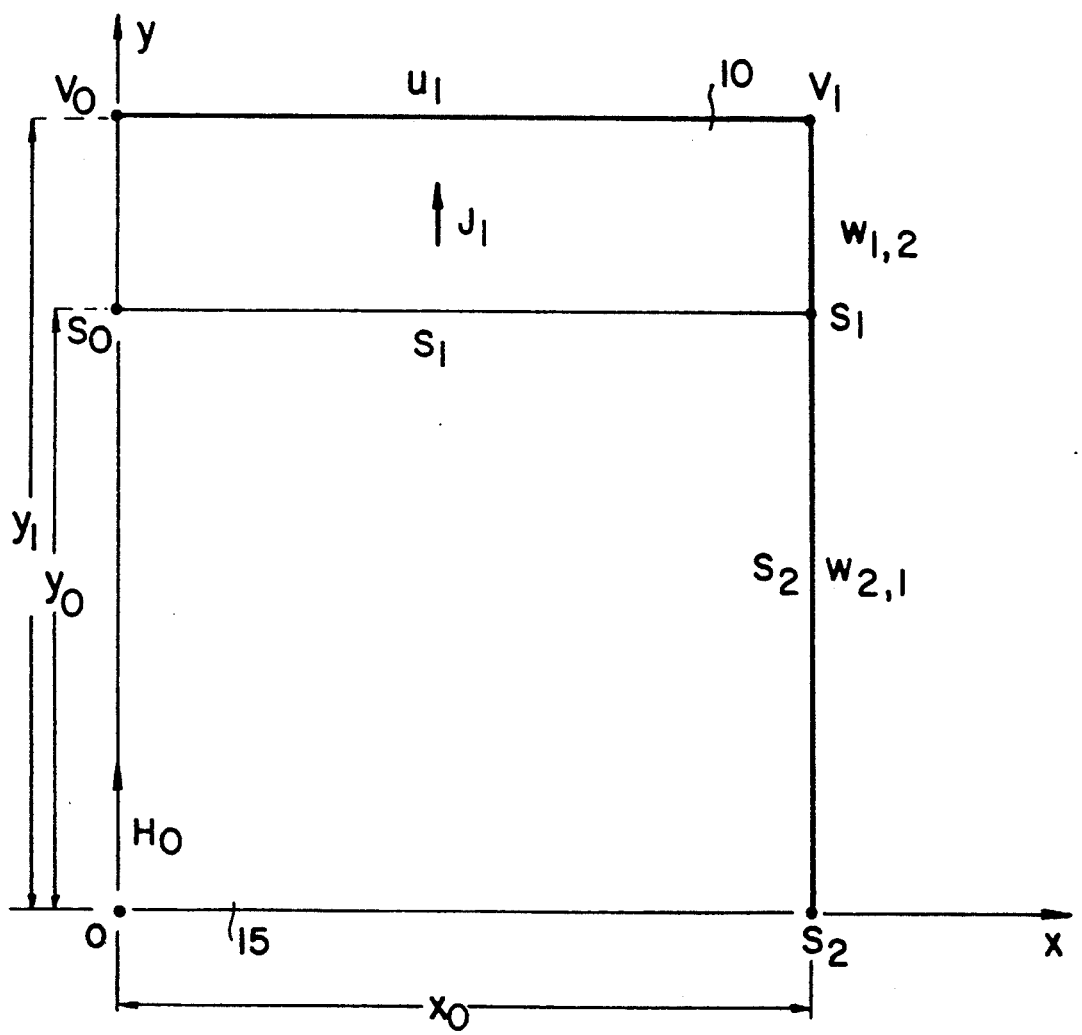
FIG. 1 illustrates a quadrant of a cross section of a two dimensional structure, for explaining the theory of my invention.
Figure 2:
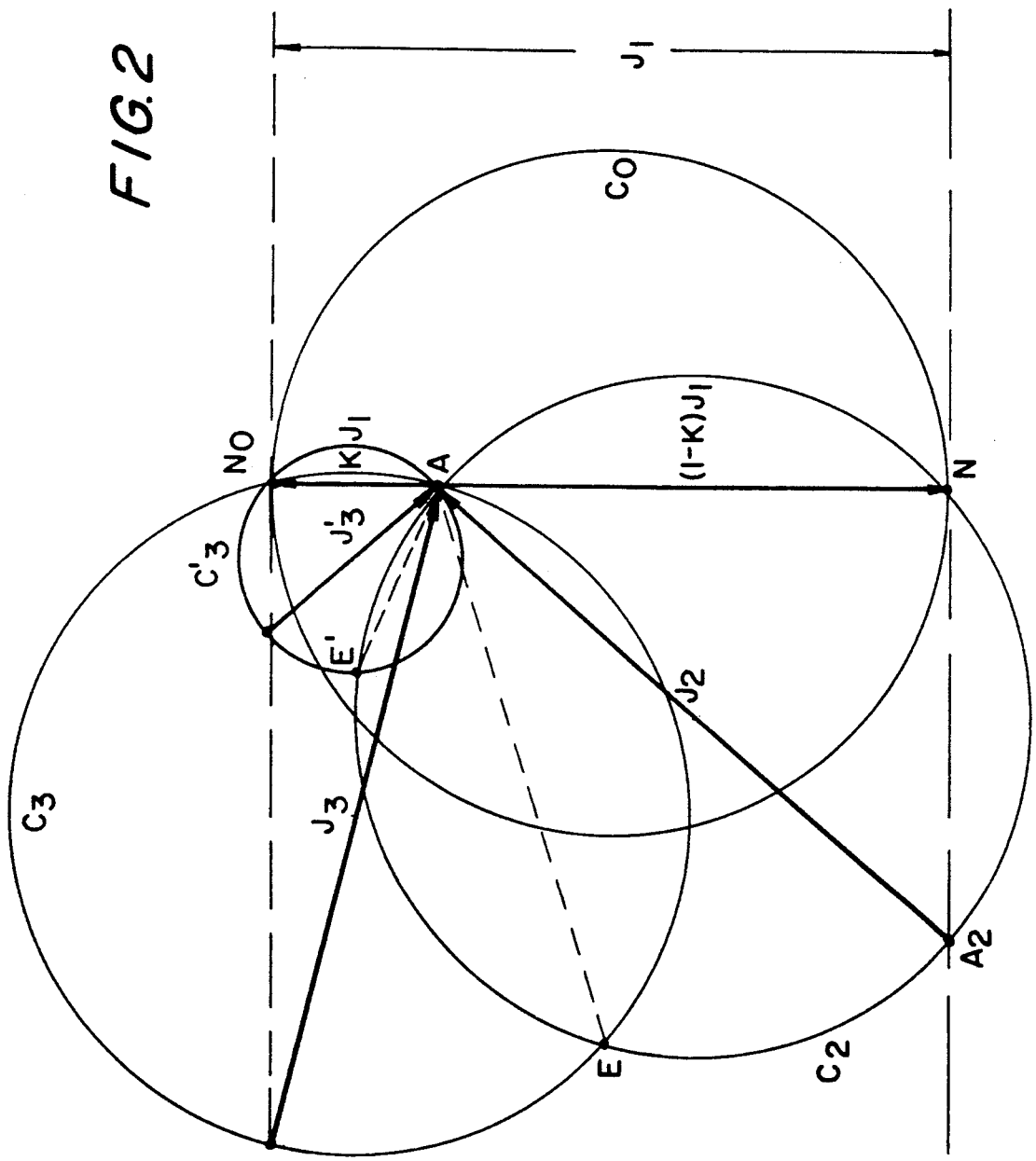
FIG. 2 is a vector drawing of a magnetic structure designed to generate a one-dimensional flux of $\vec{B}$, for explaining the structures of FIGS. 1 and 3.

FIG. 2, illustrates a vector diagram illustrating the conditions existing in the arrangement of FIG. 1. FIG. 2 is a particular case of the general matter of determining the magnetization and the geometry of each component of a magnetic structure. Circle $C_0$ has a diameter equal to the magnitude of the magnetization $J_1$, the vector $J_1$ extending upwardly from a point N to a point $N_0$. A point A is located on the line N-$N_0$, and the vector A-$N_0$ on this line corresponds to the field $\mu H_0$ being generated in the cavity. The vector AN, is oriented downward, and this vector is equal to $J_1-\mu H_0$ so the vector AN is equal to $J_1-\mu H_0$.

Figure 3:
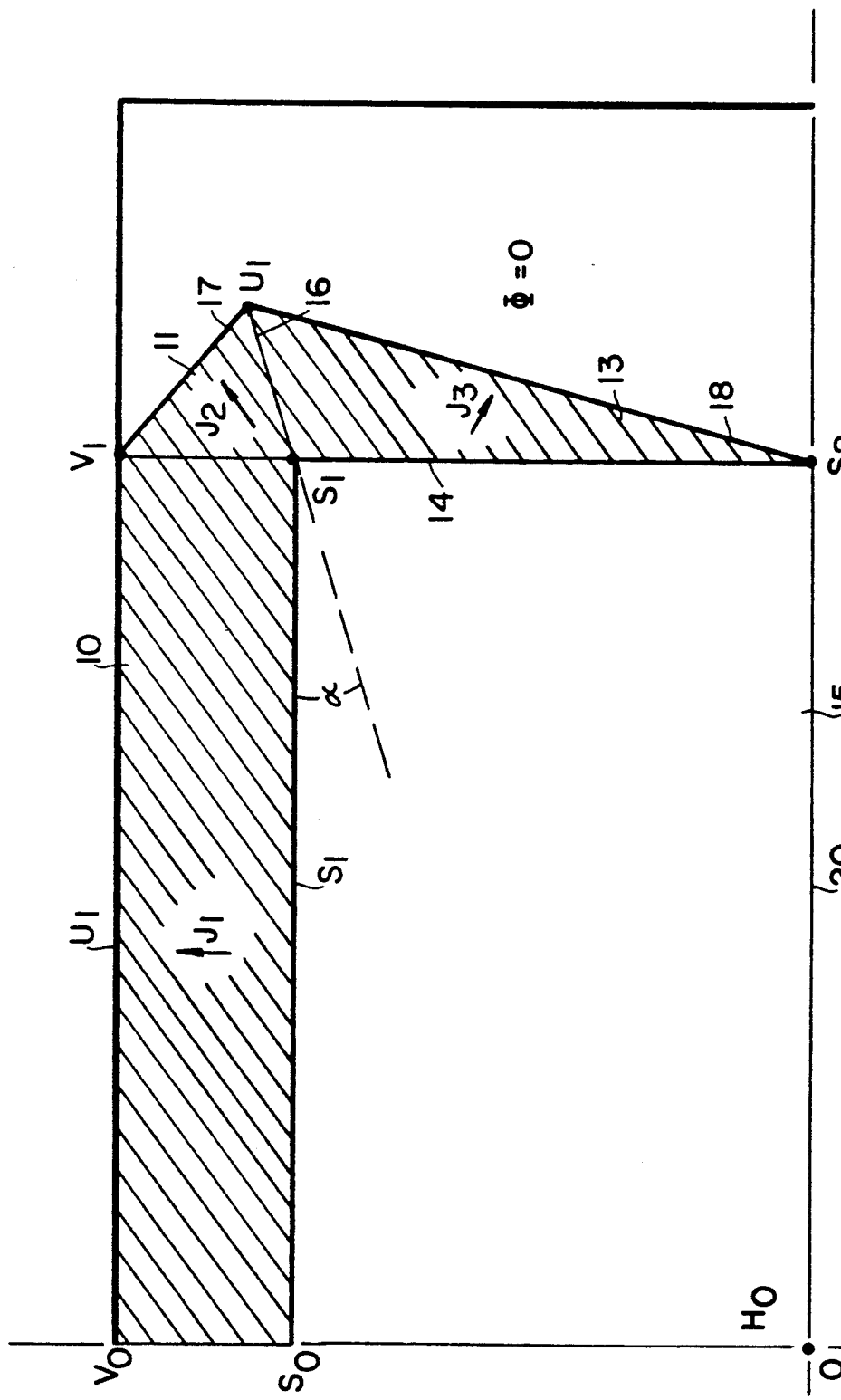
FIG. 3 is a simplified cross sectional view of a quadrant of a magnetic structure in accordance with the invention.

In accordance with one embodiment of the invention, as illustrated in FIG. 3, a quadrant of the type illustrated in FIG. 1 is provided with a first triangular cross section element 11 of magnetic material positioned with one side abutting the end of the magnetized material 10. A second triangular cross section element 13 is positioned with one side 14 thereof closing the open end of the cavity 15, and a second side abutting a side of the triangular cross section element along a line 16. The third side 17 of the element 11, and the third side 18 of the element 13 define an external interface, which, in accordance with the invention, defines an equipotential line along with the outer surface $u_1$ of the magnetic material 10. The line 16 extends at an angle $\alpha$ to the interface between the magnetiized material and the cavity 15, and hence also to the equipotential plane 20 at the center of the magnetic structure. In this arrangement, the permeability of the magnetized material 10 is $\mu_1$, the permeability of the element 11 is $\mu_2$ and the permeability of the element 13 is $\mu_3$.

In an initial calculation to derive a structure that meets the above requirements, it is assumed that $J_1 = J_2 = J_3$.

Following the general design, and referring again to FIG. 2, the magnetization and geometry of any material which interfaces with the magnetized material 10 are determined by the vector diagram inscribed in circle $C_2$ which passes through point N and point A and whose diameter is the magnitude of the magnetization $J_2$. In accordance with the invention it is necessary to maintain the continuity of the tangential component of the intensity of the magnetic field across the interface The magnetic field within the magnetized material 10 is a vector A-N, which is $(1-KJ_1)$, in FIG. 2. In the absence of magnetic induction the magnetic field within the component that interfaces with the magnetized material 10 is equal and opposite to $J_2$. Consequently the tip $A_2$ of the intensity $-J_2$ must be on the line perpendicular to $J_1$ which passes through point N. Similarly, $J_3$ is the magnetization of the component of magnetized material that interfaces with the cavity. $J_3$ is determined by the vector diagram inscribed in the circle $c_3$. Because the induction is assumed to be zero in this element, which interfaces with the cavity, the magnetic field in this element must be equal and opposite to $J_3$. To satisfy the condition of continuity of the magnetic field across the interface with the cavity, the tip of vector $-J_3$ must be on the line perpendicular to $J_1$ that passes through point $N_0$.

As illustrated in FIG. 2, a vector $J_2$ of magnitude identical to that of $J_1$ is constructed by extending from the point $A_2$ to point A. The vector $J_2$ is the diameter of a circle $C_2$. Similarly, a vector $J_3$ of the same magnitude vector $J_1$ extends downwardly from $A_3$ to point A. This vector $J_3$ is the diameter of circle $C_3$.

Since B has to be equal to 0, the intensity in a medium at the interface with the end of the magnetic medium 10 has to be equal and opposite to the vector $J_2$, and for the same reason the intensity of the medium which limits or confines the end of the cavity has to be equal and opposite to $J_3$. If a circle is drawn from point A, with a center at A and a radius $J_1$, $J_1$ is the magnitude of this vector. The point at which this circle intersects circle $C_2$, defines the other end of the vector $J_2$. The point at which this circle intersects the circle $C_3$ defines the vector $J_3$. These two vectors define the magnetization where there is no induction.

As discussed above, the line 16 (FIG. 3) separates the two triangular cross section elements 11 and 13. This line must extend in such a direction that the tangential component of the two vectors $J_2$ and $J_3$ on this line is continuous across the surface. In order to obtain this result, the line 16 must extend parallel to the line defined by the point A in FIG. 2, and the intersection of circle $C_2$ and $C_3$. The outer surfaces 17, 18 of the two triangular cross section elements is perpendicular to $J_2$ and $J_3$ respectively, and is an equipotential line since, being perpendicular to J means that they are perpendicular to H. As a result, the lines 17, 18 are equipotential. These two equipotential lines 17, 18 extend between the point $V_1$ where the potential is 0, and the point $S_2$ where again the potential is 0. The point $S_2$ lies on the equatorial plane, and consequently the potential in the two 17, 18 is also 0. Accordingly, in the above discussed arrangement, the flux is confined only within the region from O to $S_2$ (FIG. 1). There is no flux in the region to the right of the lines 17, 18. The potential in this region is 0 and therefore there is no flux. This means that the potential outside of the surface defined by lines 17, 18 is 0, so any region outside of this has 0 potential. Consequently, in the resultant structure, the surface 17, 18 defines a surface on an infinite permeability yoke.

It is of course apparent that the structure is symmetrical with respect to the equatorial plane, as well as about the line O—$V_0$. By employing the two triangular cross section elements 11, 13, it is apparent that the magnetic circuit may be closed by a yoke that is positioned anywhere. The yoke may be spaced from the surface 17, 18, or it may be adjacent the surface 17, 18, since the entire region to the right of the surface 17, 18 is a region of zero potential.

Figure 4:
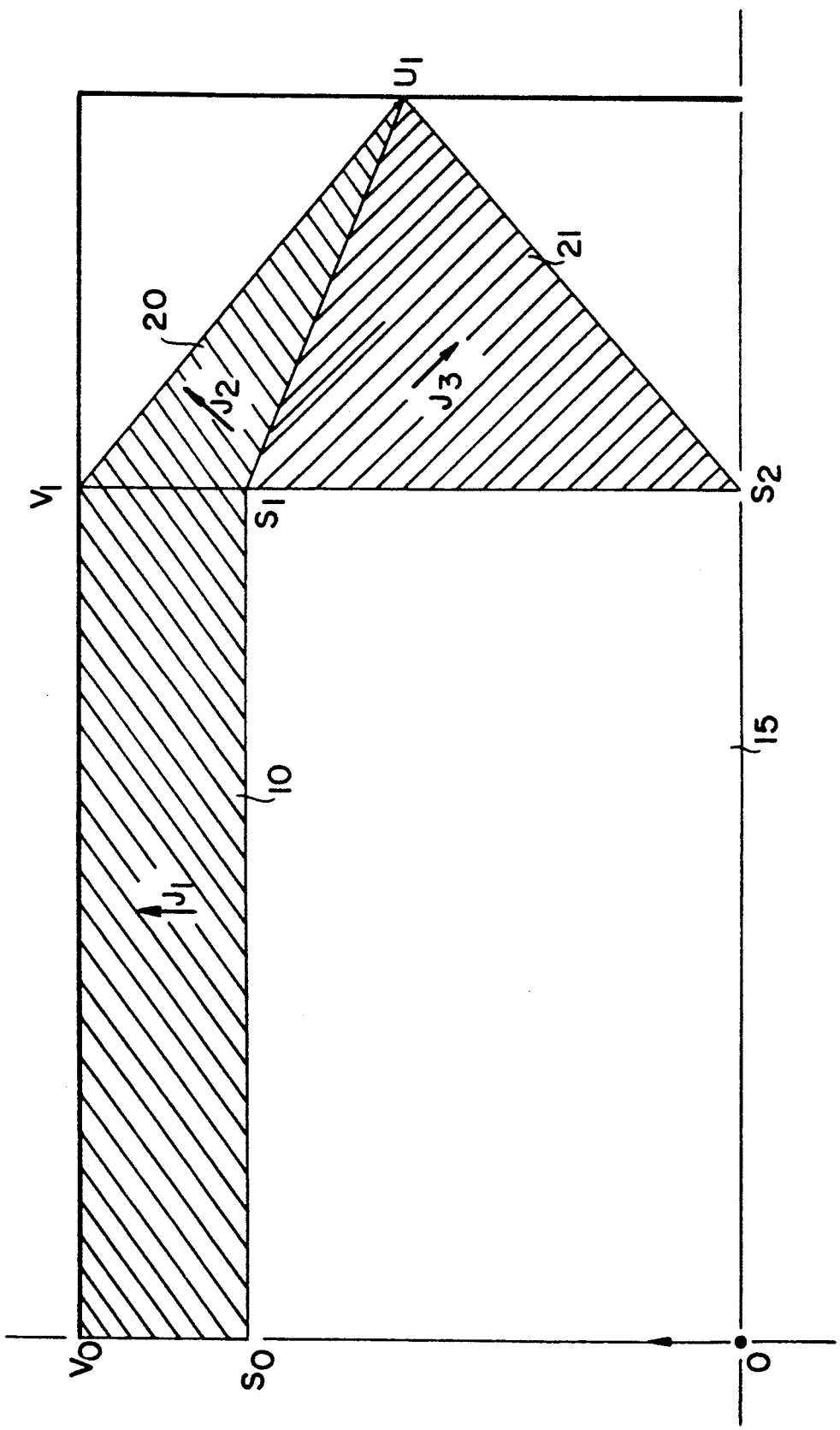
FIG. 4 is a simplified cross sectional view of a modification of the structure of FIG. 3, wherein $J_3' < J_1$.

The arrangement in accordance with the invention enables reducing the amount of energy stored inside the material, while permitting the use of lower cost materials. Thus, as illustrated in FIG. 2, a vector $J_3'$ can be drawn between the point A and the perpendicular to line $N-N_0$ at point $N_0$, that is shorter than the vector $J_3$, thereby corresponding to a lower cost material than that represented by the vector $J_3$. The vector $J_3'$ defines the diameter of a circle $C_3'$. The line joining the point A and the intersection of the circles $C_2$ and $C_3'$ extends in a direction that defines the interface between the corresponding triangular cross section magnetic elements 20, 21, as seen in FIG. 4.

In order to describe the derivation of the invention in other terms, assume first a two-dimensional prismatic cavity with a rectangular cross-section, and consider the problem of generating inside the cavity a uniform magnetic field whose intensity $\bar{H}_0$ is oriented perpendicular to the axis of the cavity and parallel to a side of the rectangle, as indicated in FIG. 1 which shows one quadrant of the cavity cross-section, whose sides are $s_1$, $s_2$.

I have presented the design of both yoked and yokeless magnets around a cavity of the type illustrated in FIG. 1 in my publications "Yokeless Permanent Magnets", T.R. 14, New York University, N.Y. Nov. 1, 1986 and "Some Considerations about Permanent Magnet Design for NMR", T.R.-13, New York University, N.Y. Feb. 1, 1986. The magnet is designed as a yoked structure, and side $s_1$ in FIG. 1 is the interface between the cavity and a region of magnetic material with remanence $\vec{J}_1$ oriented parallel to the y axis. Line $u_1$ is the interface between the same region of magnetic material and a yoke of infinite magnetic permeability and $u_1$ is an equipotential line $\Phi=0$. Within the rectangular region $(OV_0V_1S_2)$ the flux of $\vec{B}$ is uniform and parallel to the y axis, and $$\vec{B} = K\vec{J}_1 \qquad (4)$$

where $K \leq 1$.

In FIG. 1 side $(V_1 S_2)$ is parallel to $\vec{B}$. Instead of assuming that $s_2$ is the interface between the cavity and a component of magnetic material of a yoked magnet, consider $s_2$ as a side of the cavity of a yokeless magnet with the additional assumption that $s_2$ is the interface between the cavity and a magnetic material where:

$$\vec{B} = O \qquad (5)$$

Assume that the medium of remanence $\vec{J}_1$ is confined by line $w_{1,2}$ as shown in FIG. 1, and assume also that $w_{1,2}$ is the interface between the medium of remanence $\vec{J}_1$ and a magnetic material where $\vec{B}$ also satisfies this condition.

The calculation of the yokeless magnetic structure to be inserted between line $(V_1 S_2)$ and the surrounding medium is given by the vector diagram of FIG. 2. If the remanence of the components of this structure is equal to the magnitude of $\vec{J}_1$, the geometry of the structure is provided by the vector diagrams inscribed in the two circles $c_2$ and $c_3$ that pass through points A, N and A, $N_0$ respectively, as indicated in FIG. 2. The resulting structure is shown in FIG. 3. The remanence of the magnetic material is regions $(V_1 S_1 U_1)$ and $(S_1 S_2 U_1)$ are vectors $\vec{J}_2$, $\vec{J}_3$ whose tips coincide with point A in FIG. 2. Thus, in both regions, condition 3 is satisfied and the intensities $\vec{H}_2$, $\vec{H}_3$ are equal and opposite to $\vec{J}_2$, $\vec{J}_3$ respectively. Interface $(V_1 U_1)$ in FIG. 3 is perpendicular to $\vec{J}_2$ and interface $(V_2 U_1)$ is perpendicular to $\vec{J}_3$. The interface $(S_1 U_1)$ between the two regions of magnetic material is parallel to the dotted line which passes through point A and the second point E of intersection of circles $c_2$, $c_3$.

The region outside boundary $(V_1 U_1 S_2)$ in FIG. 3 is a $\Phi=0$ equipotential region. A closed boundary of the external yoke is necessary to close the flux of the magnetic induction which crosses line $u_1$ in FIG. 1. In the ideal limit of an infinite magnetic permeability yoke, any arbitrary closed line can be chosen outside boundary $(V_1 U_1 S_2)$, as for instance the rectangular geometry shown in FIG. 3. Obviously line $(V_0 V_1 U_1 S_2)$ could be the interface between magnetic structure and yoke.

The magnet configuration of FIG. 3 makes it possible to generate the one-dimensional flux of induction $\vec{B}$ within both cavity and magnetic structure as well. The figure of merit of the two-dimensional structure of FIG. 3 is $$M = \cfrac{K(1-K)}{1 + \cfrac{y_0}{2x_0} \cdot \cfrac{1}{(\sqrt{(1-K)^3(1+K)}) + (\sqrt{K^3(2-K)})}} \qquad (6)$$

where $2x_0$, $2y_0$ are the dimensions of the rectangular cavity in the directions perpendicular and parallel to intensity $\vec{H}_0$ respectively.

In the limit of $y_0 << x_0$, M approaches the figure of merit of an ideal, one dimensional yoked magnet whose value is given by $$M = K(1-K) \qquad (7)$$

The two triangular regions of FIG. 3 with remanences $\vec{J}_2$, $\vec{J}_3$ do not contribute to the energy of the field inside the cavity. Thus it may be of practical interest to modify the structure of FIG. 3 by using materials with lower remanences to design the two triangular regions. This is possible as long as the two regions have remanences $\vec{J}_2$, $\vec{J}_3$ of magnitudes $$J_2' \geq (1-K)J_1, \quad J_3' \geq KJ_1 \qquad (8)$$

For instance, the vector diagram of FIG. 2 provides the change of the geometry of the magnetic structure resulting from a selection of remanences $$J_2' = J_1, \quad J_3' < J_1 \qquad (9)$$

The geometry and the orientation of the remanences in the new B=0 region of magnetized material is provided by the vector diagrams inscribed in circles $c_2$, $c_3$ of FIG. 2, where $c_3$ is the circle of diameter $J_3$. The resulting magnetic structure is shown in FIG. 4. The interface $(S_1 U_1)$ is parallel to the dotted line that joins point A and the point E' of intersection of circles $c_2$ and $c_3$ in FIG. 2.

The selection of a remanence $J_3 < J_1$ results in an area of triangle $(S_1 V_1 U)$ larger than the area of triangle $(S_1 V_1 U')$. Thus, in a general case, the selection of a lower remanence material does not necessarily result in a higher figure of merit and a lower cost of the magnet.

Figure 5:
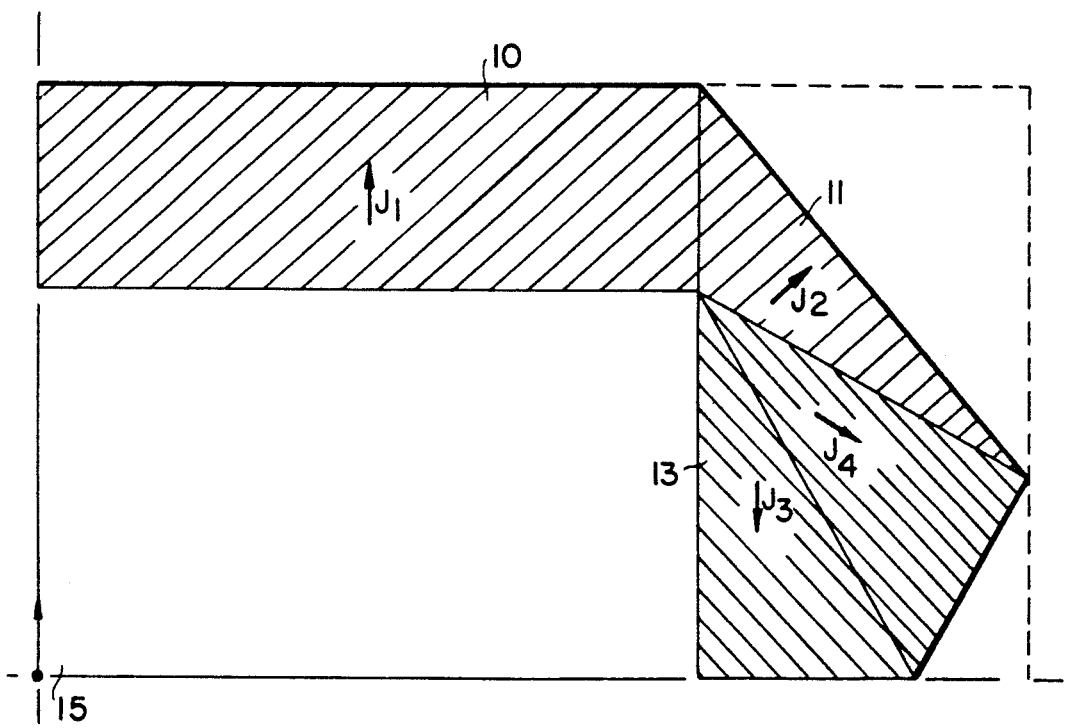
FIG. 5. is a simplified cross sectional view of a further modification of the structure of FIG. 3, wherein $J_4$ and $J_5$ are equal to $J_3'$.

The geometry of the yoke of FIG. 4 can be modified by eliminating, for instance, the air gap between the magnetic material and the $\mu = \infty$ yoke, as shown in FIG. 5 where two regions of remanence $J_3'$ have replaced the single triangle of FIG. 4.

Since the invention readily enables the use of a lower cost material for all or part of the closing structure of the magnet, it is practical to compute a figure of merit in terms of the cost of the structure, rather in terms of the energy. As above discussed, it is immaterial whether the yoke for channeling the flux touches the equipotential surface defined by the triangular cross section elements, or whether a gap is provided between these surfaces and the yoke.

It is not necessary that the end structure consist only of two triangular cross section elements. Thus, as illustrated in FIG. 5, additional elements may be provided. The permeabilities and angle of the interfaces of these elements is determined in the same manner as in the case of the structures of FIGS. 3 and 4.

Figure 6:
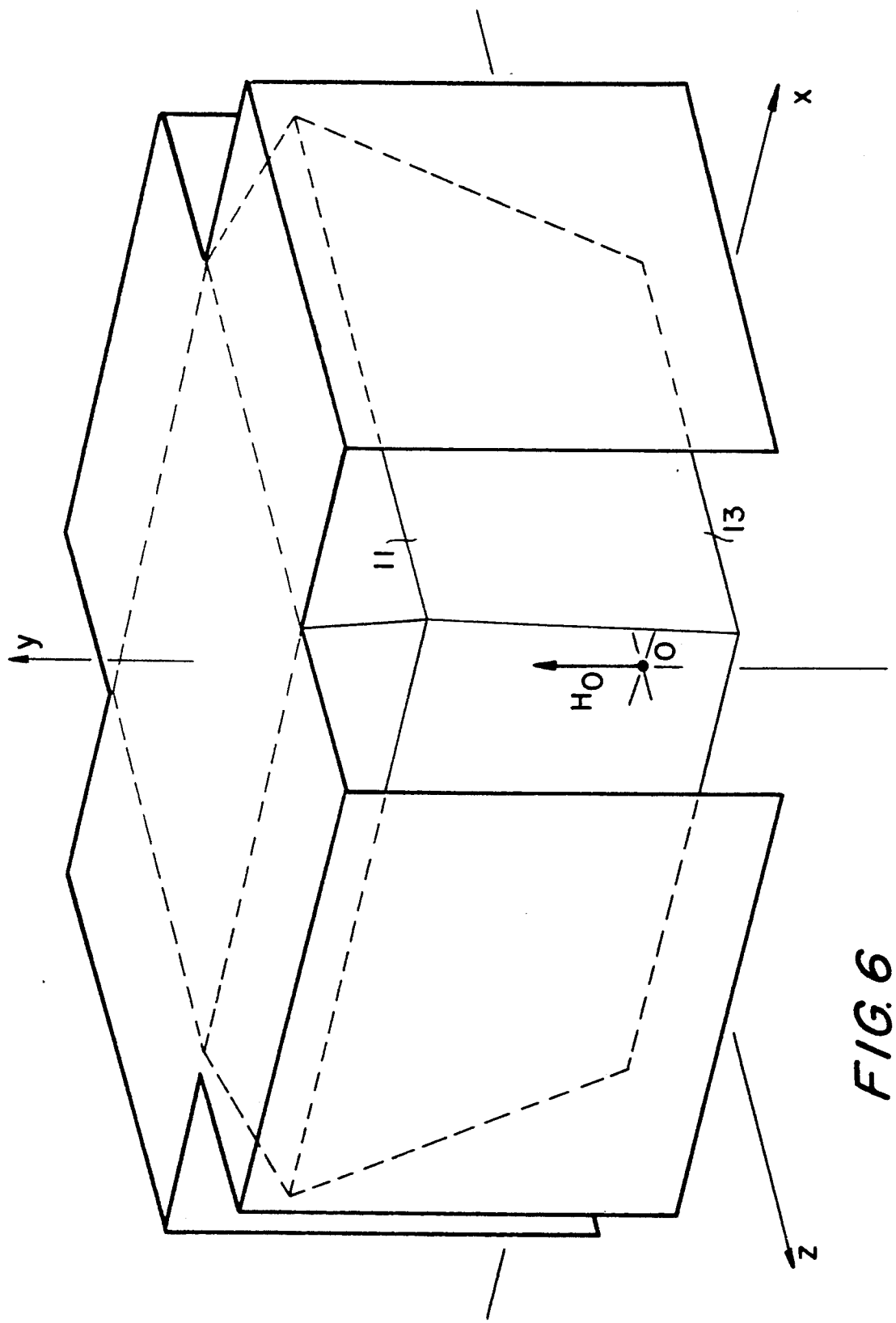
FIG. 6 is a perspective view of the portion of magnetic structure of the invention, for $y > 0$, and showing one embodiment of the geometry of a yoke.

As discussed above, the configuration of the yoke is not critical in a structure in accordance with the invention. For example, the yoke may be in the form of a closed box. Alternatively, is may be in the form of a box with open corners, as illustrated in FIG. 6. This figure corresponds to the structure of FIG. 4, depicting only a single quadrant of the structure.

Figure 7:
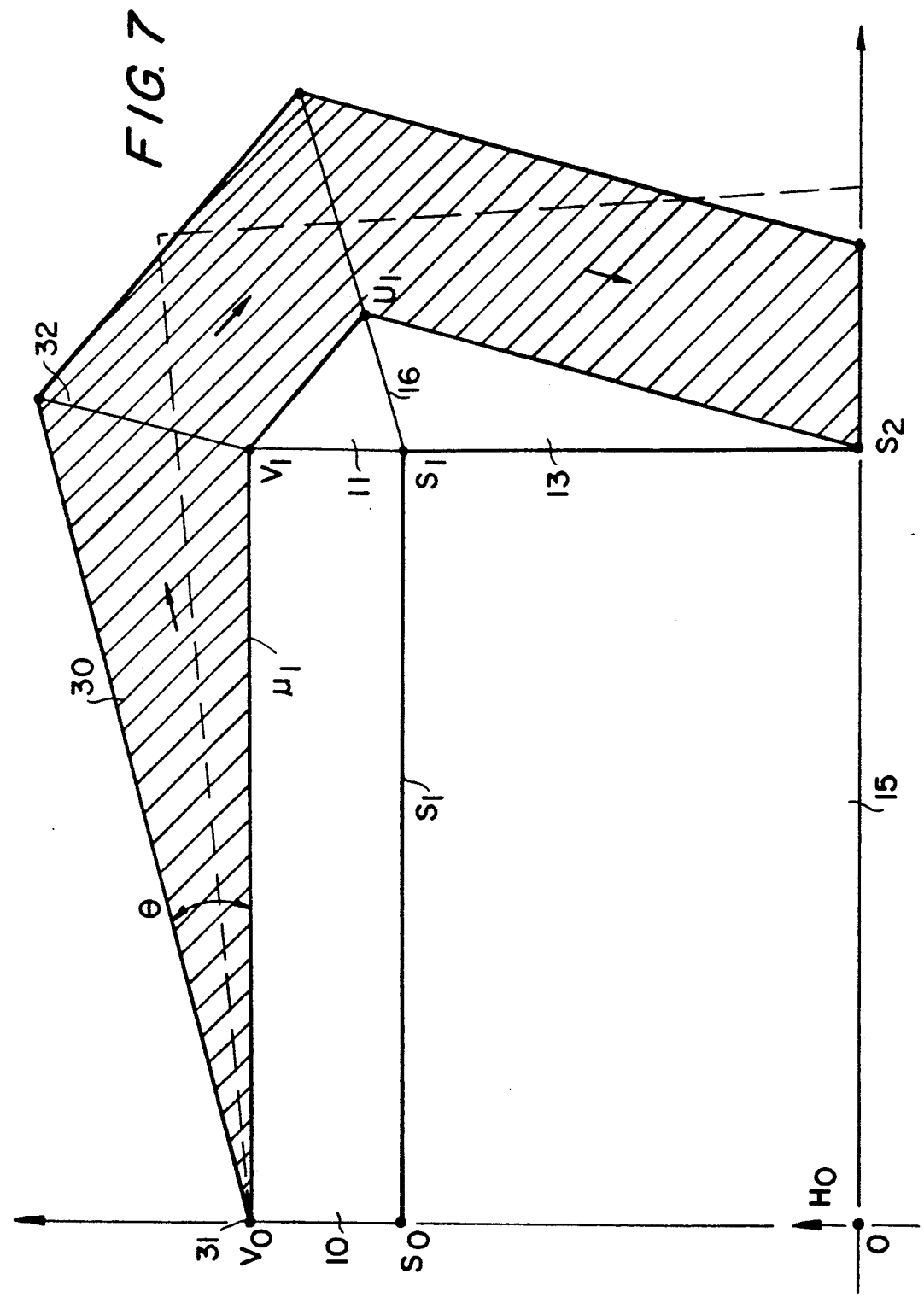
FIG. 7 is a simplified cross sectional view of a quadrant of a magnetic structure of the type shown in FIG. 3, and further illustrating another embodiment of a yoke geometry.

For example, as illustrated in FIG. 7, which depicts a yoke structure surrounding a magnet structure as shown in FIG. 4, The yoke 30 has a zero thickness at the center of the magnetic structure, at point 31. The thickness of the yoke increases toward the end of the structure, and the same thickness is maintained in the portions of the yoke adjacent the triangular cross section elements 11 and 13. The interface 32 between the portion of the yoke abutting the magnetized material 10 and that abutting the element 11, extends at an angle from the point $V_1$ that bisects the lines $u_1$ and 17. The interface between the portions of the yoke adjacent the elements 11 and 13 extends parallel to the line 16.

The closing of the flux of $\vec{B}$ within an equipotential region of the magnet can be achieved with the use of a high permeability ferromagnetic yoke, or alternatively such a high permeability yoke can be replaced by a structure of magnetic material where:

$$\vec{B} = \vec{J} \tag{10}$$

For example, as illustrated in FIG. 7, which depicts a yoke structure surrounding a magnet structure as shown in FIG. 4, The yoke 30 has a zero thickness at the center of the magnetic structure, at point 31. The thickness of the yoke increases toward the end of the structure, and the same thickness is maintained in the portions of the yoke adjacent the triangular cross section elements 11 and 13. The interface 32 between the portion of the yoke abutting the magnetized material 10 and that abutting the element 11, extends at an angle from the point $V_1$ that bisects the lines $u_1$ and 17. The interface between the portions of the yoke adjacent the elements 11 and 13 extends parallel to the line 16. In this figure, the cross-hatched area is a magnetic material that satisfies the condition $\vec{B} = \vec{J}$. The heavy arrows in the cross hatched area indicate the orientations of the remanences, and these remanences are parallel to the external boundary of each component of the structure. The geometry of FIG. 7 corresponds to the selection of a remanence $\vec{J}$ within the cross hatched area of FIG. 7 that is equal in magnitude to the remanence $J_1$ of the rectangular region ($V_0 V_1 S_1 S_0$) ($V_0 V_1$) is the interface between this region and the triangular component of the new structure whose external boundary forms an angle $\Theta$ with respect to the axis x given by $$\sin \Theta = K \tag{11}$$

As in the case of the $\mu = \infty$ ferromagnetic yoke, the internal boundary of the other two components of remanence $\vec{J}$ can be selected arbitrarily. FIG. 7 corresponds to the particular case where ($V_1 U_1 S_2$) is the interface between the material of remanence $\vec{J}$ and the two components of the magnetic structure, where $\vec{B} = 0$.

The dotted line in FIG. 7 shows the external boundary of a yokeless, single layer magnet designed in accordance with the method developed in the article "Yokeless Permanent Magnets", M. G. Abele, T.R.-14, New York University, N.Y., Nov. 1, 1986. This magnet is designed around the rectangular cavity (O $S_0 S_1 S_2$) for the same value of K. The difference in total area between the two magnetic structures is apparent. The yokeless magnet, wherein each component generates and channels the flux of $\vec{B}$, requires a smaller volume of magnetic material.

Figure 8:
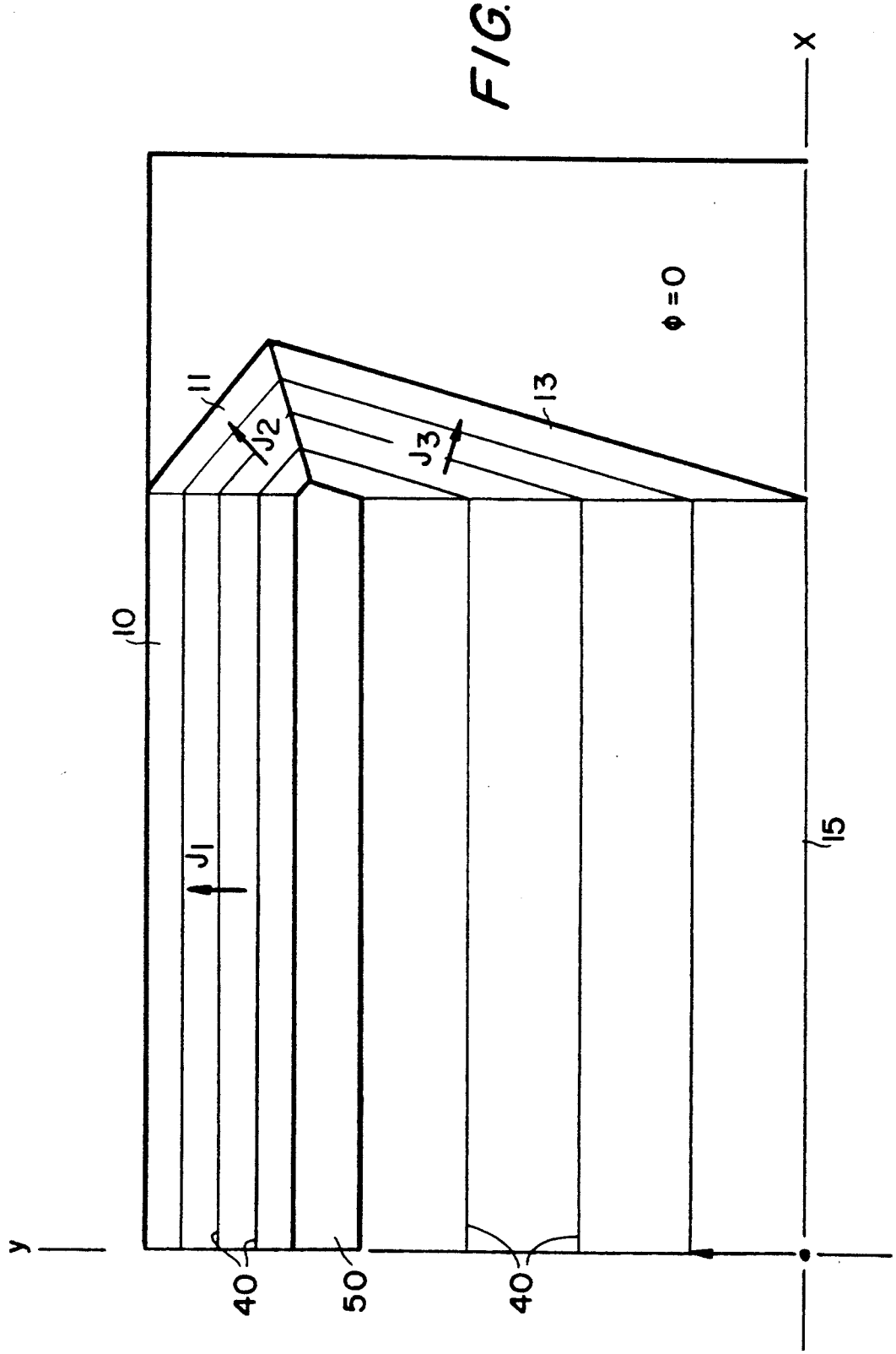
FIG. 8 is a view in accordance with FIG. 3, and further illustrating a filter in accordance with the invention.

Referring now to FIG. 8, therein is illustrated the quadrant of the magnetic structure of FIG. 3, showing a plurality of equipotential lines 40 extending through the magnetized material 10, the cavity closure elements 11 and 13, and the cavity 15. In the absence of any perturbations in the magnetic structure, these lines are straight and parallel, as illustrated, and provide a uniform fiel $H_0$ in the cavity.

Figure 9:
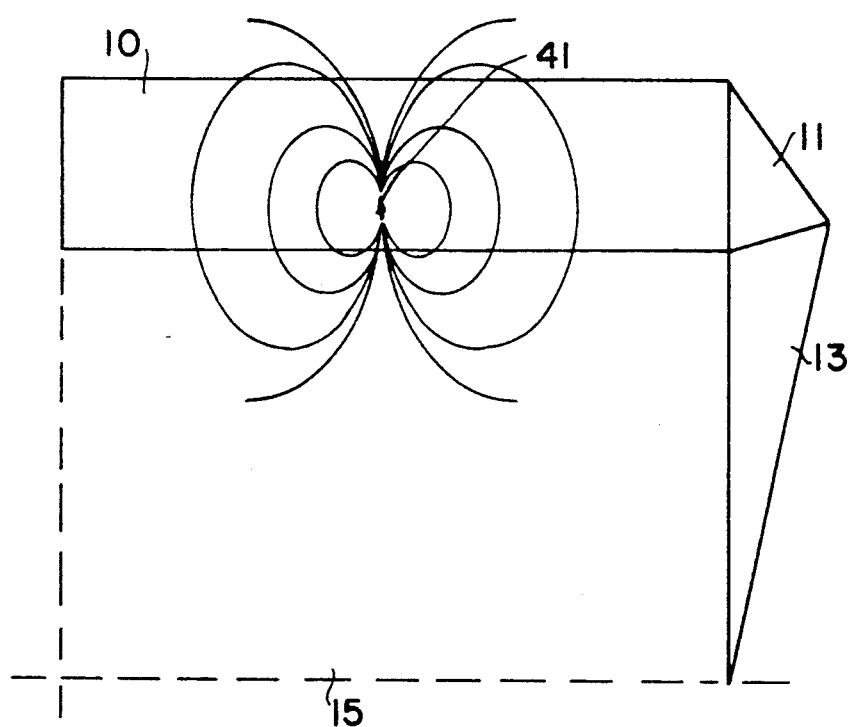
FIG. 9 is a view illustrating the effect of perturbations in a magnetic structure.

Suppose, however, that the magnetism is not perfectly uniform, for example a perturbation 41 in the magnetized material as illustrated in FIG. 9. The perturbation may have a larger or smaller magnetization than the remainder of the material. The field generated by this perturbation changes the local mangetization, and the material of the magnetized material is transparent to this field. The perturbation generates a dipole field that extends throughout the structure. As a consequence, the field in the cavity is no longer uniform.

In accordance with the invention, in order to minimize the effect of the perturbation in the cavity, a layer 50 of high permeability material is provided at the interface between the magnetized material 10 and the cavity. This layer has a uniform thickness, and may have a $\mu$ of, for example, 4 or 5 thousand. Due to the use of this layer 50 of high permeability, the effect of the field of the perturbation on the field in the cavity is very small. The layer 50 acts as a shield or filter to minimize the effect of the field of the perturbation on the field in the cavity. Since the layers 50 have a uniform thickness, they do not serve to shape the field, the shape of the field being the same either with or without them.

Considering the arrangement of the invention of FIG. 8 in greater detail, the field configuration is not perturbed if an equipotential surface is assumed to be a surface of infinite magnetic permeability. This surface may be an open surface with an arbitrary boundary, or it may be closed, in which case a region of the field is removed from the structure.

In the case of the two-dimensional yoked magnet analyzed in this paper, the flux configuration of FIG. 3 is maintained in the modified structure of FIG. 8 where a closed equipotential surface of potential $\Phi$ has been transformed into the boundary of a $\Phi = \infty$ material 50.

If the insertion of the $\mu = \infty$ material has no effect on the field generated by the structure of FIG. 3, it has an effect on the field perturbation caused by a departure from ideal magnetic properties like, for instance, actual demagnetization characteristics and, most importantly, magnetization tolerances. In this case, the $\Phi = \infty$ material 50 acts like a spatial filter, which filters out the field perturbation caused by fabrication and magnetization tolerances.

In FIG. 8 geometries of the equipotential lines 40 are not similar. Thus the choice of the $\mu = \infty$ boundary affects the figure of merit. The area of the magnetic material in the region of remanences $\vec{J}_1$ between the $\Phi = 0$ and $\Phi = \overline{\Phi}$ equipotential lines is $$A_{m1} = \frac{K}{1-K} (x_0 y_0) \frac{\overline{\Phi}}{\Phi_0} \qquad (12)$$

The area of the two regions of remanences $\vec{J}_2$, $\vec{J}_2$ between the $\Phi = 0$ and $\Phi = \overline{\Phi}$ lines is $$A_{m2} = \frac{K}{1-K} \frac{y_0^2}{\sqrt{(1-K)^3 (1+K)} + \sqrt{K^3(2-K)}} \left[1 - \frac{\overline{\Phi}}{2\Phi_0}\right] \frac{\overline{\Phi}}{\Phi_0} \qquad (13)$$

and the area of the cavity between the $\Phi = 0$ and $\Phi = \overline{\Phi}$ line is $$A_c = x_0 y_0 \frac{\overline{\Phi}}{\Phi_0} \qquad (14)$$

Thus the figure of merit is $$M = \frac{K(1-K)}{1 + \frac{y_0}{x_0} \frac{1}{\sqrt{(1-K)^3(1+K)} + \sqrt{K^3(2-K)}} \left[1 - \frac{\overline{\Phi}}{2\Phi_0}\right]} \qquad (15)$$

The value of M given by this equation is smaller than that for the structure of FIG. 3, as above stated, i.e. the transformation of the $\overline{\Phi}$ line into the $\mu = \infty$ boundary results in a decrease of the figure of merit. The equation for the figure of merit for the structure of FIG. 8 shows that the figure of merit does not vanish for $\overline{\Phi} = 0$.

Figure 10:
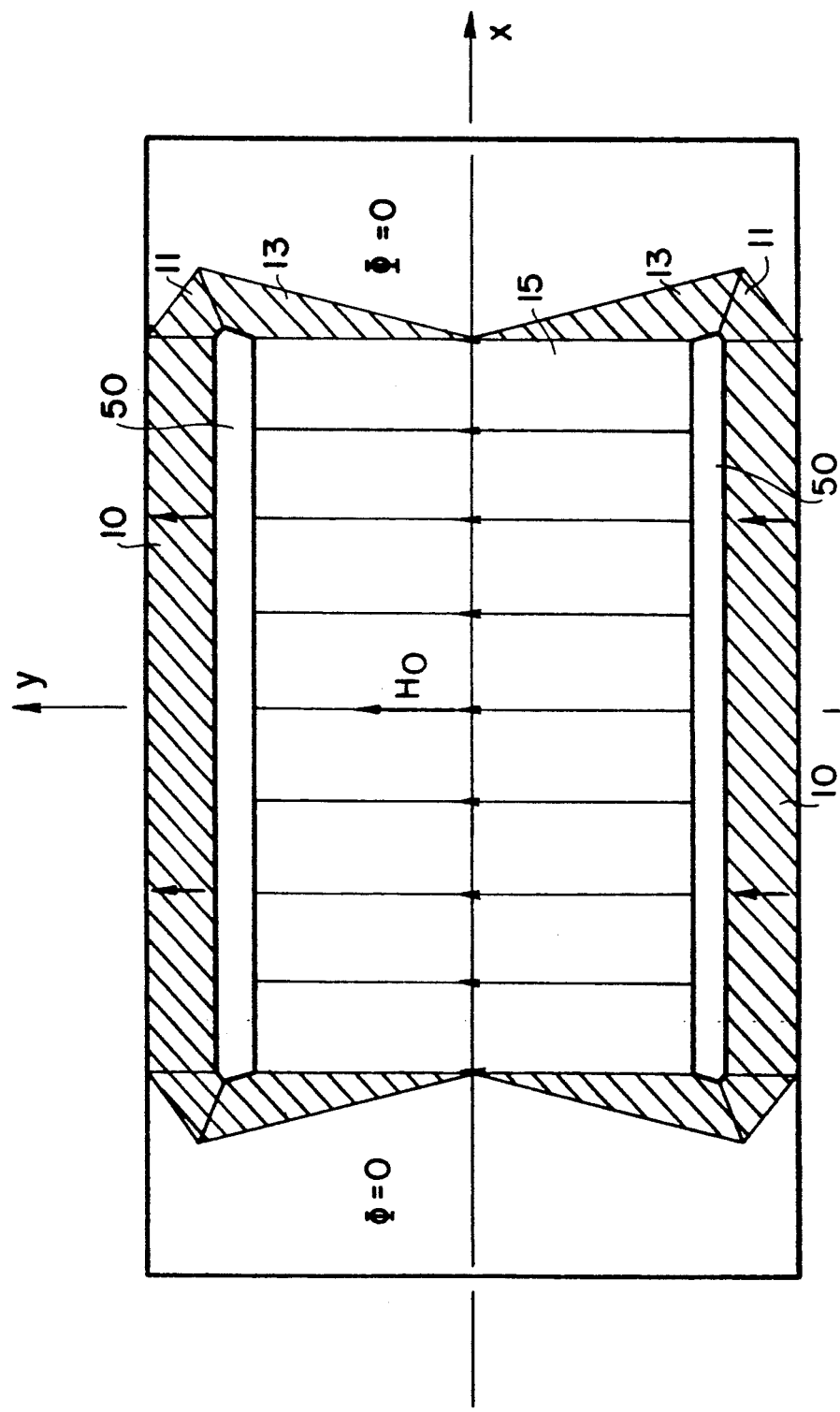
FIG. 10 is a simplified full cross sectional view of a magnetic structure in accordance with FIG. 8.

The schematic of FIG. 10 shows the lines of flux of $\vec{B}$ in the cross-section of the magnetic structure. Since $\vec{B}$ is exactly equal to zero in the regions of remanence $\vec{J}_2$ and $\vec{J}_3$, the design of the two-dimensional structure is readily extended to the design of a three dimensional yoked magnet with a unidirectional flux of $\vec{B}$.

Assume for instance a rectangular prismatic cavity with dimensions $2x_0$, $2y_0$, $2x_0 = 2x_0$ and assume that $\vec{H}_0$ is oriented in the direction of the axis y. The vector diagram of FIG. 2 provides the two identical geometries of the two-dimensional structures with axes z and x. If the two structures are cut in the two planes $$x = \pm z \qquad (16)$$

the $\pi/2$ wedges can be joined together and the boundary conditions on these two planes are automatically satisfied because the magnetic induction is oriented everywhere along the axis y. Thus no additional magnetic structure is required to establish the transition between the structures computed in the x, y and y, z planes. This conclusion is valid also if $z_0 \neq x_0$ as long as the magnetic components of remanences $\vec{J}_2$ and $\vec{J}_3$ are cut in planes oriented at $\pi/4$ with respect to the $z = 0$ and $x = 0$ planes. In the more general case of a prismatic cavity with a polygonal base, the magnetic components of remanences $\vec{J}_2$, $\vec{J}_3$ are cut in planes that bisect the angles between the lateral faces of the prism. Because of the assumption of a $\mu = \infty$ yoke, no geometrical continuity must be maintained between the closed yokes selected for the individual wedges.

Figure 13:
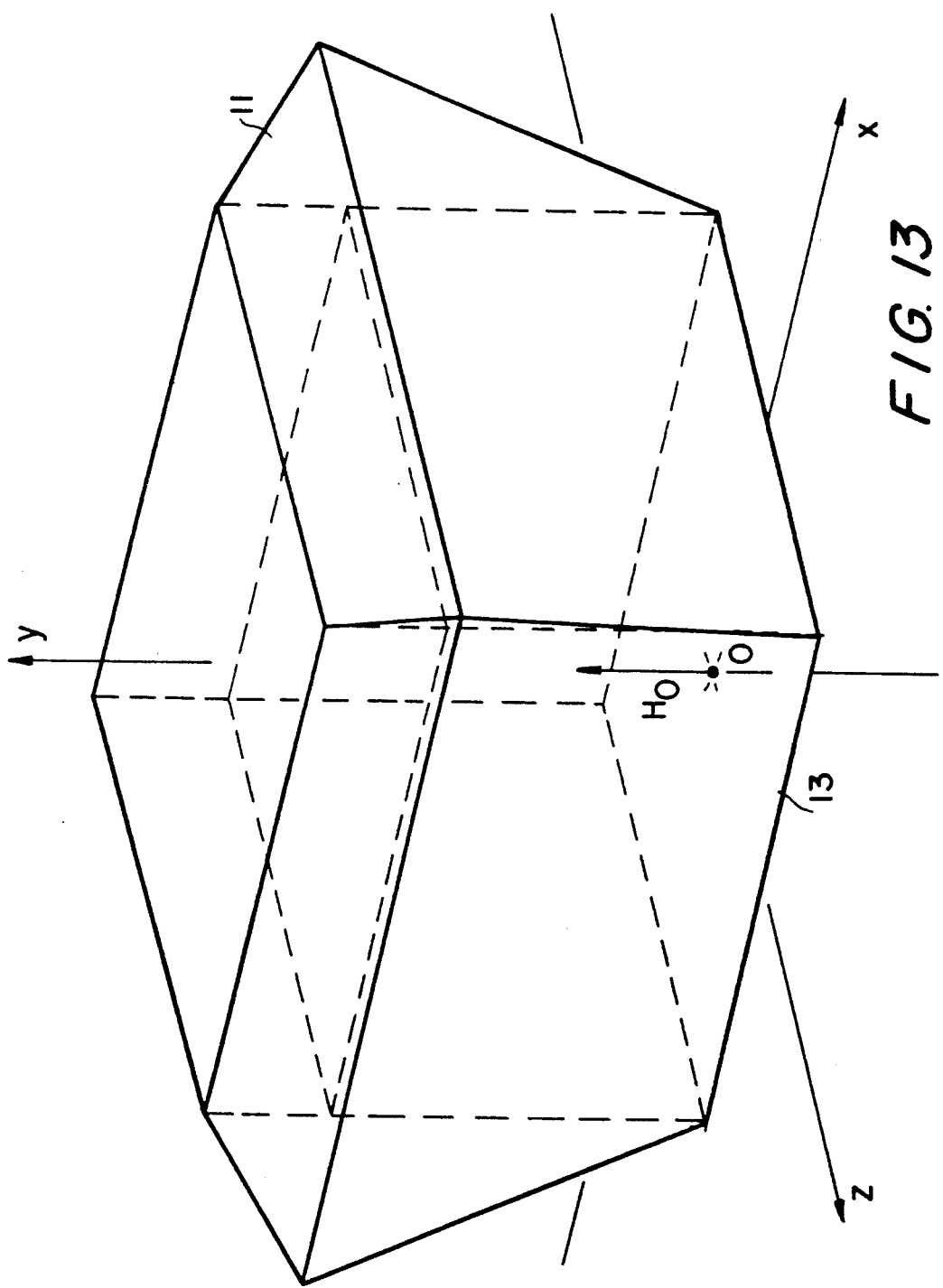
FIG. 13 is a perspective view of a part of a magnetic structure in accordance with the invention, enclosing a prismatic cavity.
Figure 14:
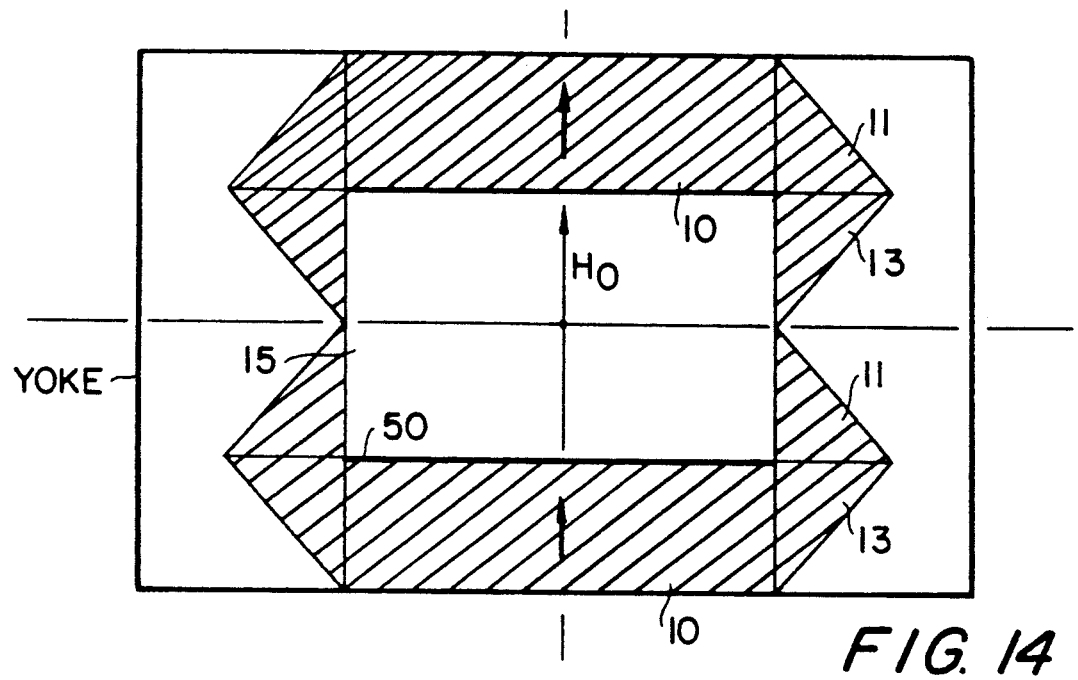
FIG. 14 is a cross sectional view illustrating a closed yoke configuration that may be employed in accordance with the invention.
Figure 15:
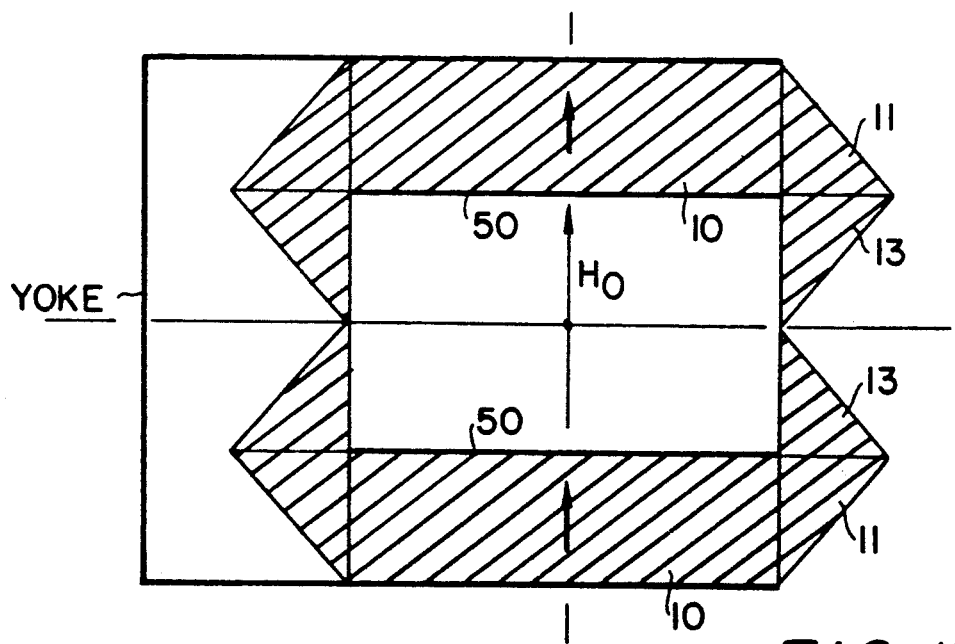
FIG. 15 is a cross sectional view illustrating an open yoke configuration that may be employed in accordance with the invention.

The external boundary of the three-dimensional magnetic structure enclosing a rectangular prismatic cavity is shown in FIG. 13 in the half space $y > 0$. In the schematic of the yoke is shown in FIG. 6 again the half space $y > 0$. As indicated in the figure, the yoke can be partially open because no field is present in the region between the yoke and the magnetic structure. FIGS. 14 and 15 show the schematics of closed and open yoke configurations that may be employed, in accordance with the invention.

Figure 12:
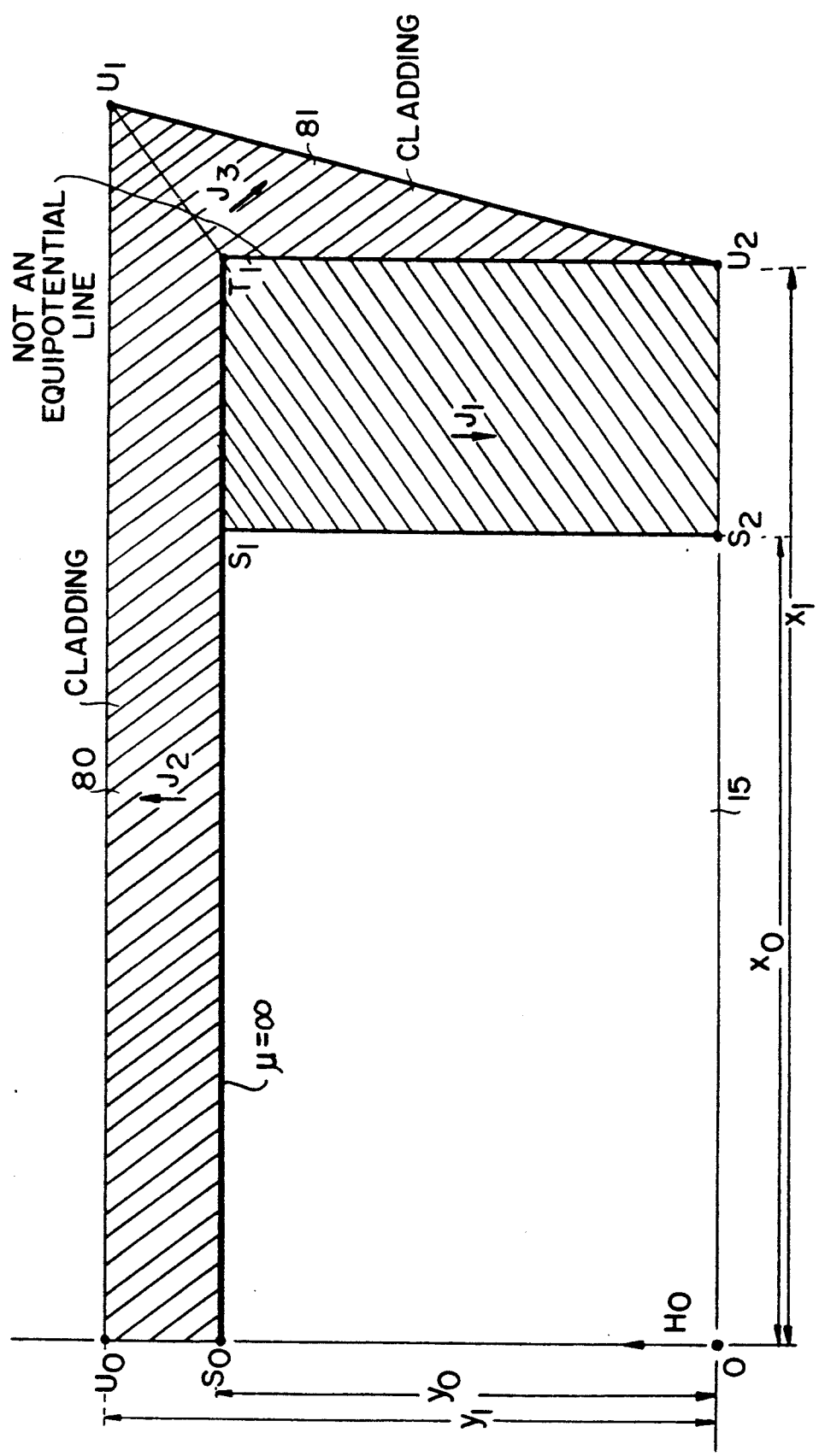
FIG. 12 illustrates a conventional magnet structure of clad design.

The uniform field within the rectangular cavity (O $S_0$ $S_1$ $S_2$) can also be generated with the known hybrid magnetic structure of FIG. 12 where the magnetic material in the rectangular region ($S_1$ $T_1$ $U_2$ $S_2$) has a remanence $\vec{J}_1$ oriented in the direction opposite to $\vec{H}_0$ with a magnitude:

$$J_1 = \frac{\mu_0 H_0}{1-K} \qquad (17)$$

where $\mu_0$ is the permeability of a vacuum. The abscissas $x_0$, $x_1$ of points $S_2$ and $U_2$ are related by the equation $$x_1 = \frac{x_0}{1-K} \qquad (18)$$

The flux of the magnetic induction $\vec{B}_1$ generated by the remanence $\vec{J}_1$ closes into the cavity through the $\mu = \infty$ surface ($S_0$ $T_1$). The area of the cross-section of the region of remanence $\vec{J}_1$ is:

$$A_{m1} = \frac{K}{1-K} x_0 y_0 \qquad (19)$$

which is equal to the area of region ($S_0$ $V_0$ $V_1$ $S_1$) of the magnetic structure of FIG. 3.

Interface ($T_1$ $U_2$) is not an equipotential surface, and the potential of the $\mu = \infty$ surface ($S_0$ $T_1$) is not zero. As a consequence, boundary ($S_0$ $T_1$ $U_2$) cannot be the interface between the magnetic structure and the surrounding medium, and the surface ($S_0$ $T_1$) cannot be part of a closed surface of $\mu = \infty$ material. A structure of magnetized material that satisfies condition $\vec{B} = 0$ has to be inserted between boundary ($S_0$ $T_1$ $U_2$) and the surrounding medium, as shown in FIG. 12. If the remanences $\vec{J}_2$ and $\vec{J}_3$ have the same magnitude of $\vec{J}_1$, boundary ($U_0$ $U_1$) is located at a distance $y_1$ from the axis:

$$y_1 = K y_0 \qquad (20)$$

and the orientation of boundary ($U_1$ $U_2$) is the same as that of interface ($U_1$ $S_2$) in FIG. 3 as derived from the vector diagram of FIG. 2.

The essential difference between the structure of FIG. 12 and the structure of FIG. 3 is that in FIG. 12 the flux closes inside the $\bar{B}=0$ layer 80, 81, which envelops the rest of the magnet. A magnet design following the approach of FIG. 12 is known as "cladding" ("Applications of Cobalt-Samarium Magnets to Microwave Tubes", W. Newgebauer and E. M. Branch, General Electric Co., Schenectady, N.Y., Mar. 15, 1972; J. P. Clarke and H. A. Leupold, IEEE Trans. Magn. MAG-22, No. 5, p 1063, 1986; and H. A. Leupold and E. Potenziani, IEEE Trans. Magn. MAG-22, No. 5, p 1078, 1986). The area of magnetic material in the $\bar{B}=0$ region of FIG. 12 is substantially larger than the area of the material in the $\bar{B}=0$ region 11, 13 of FIG. 3, and, as a consequence, the figure of merit of the magnet of FIG. 12 is lower.

Figure 11:
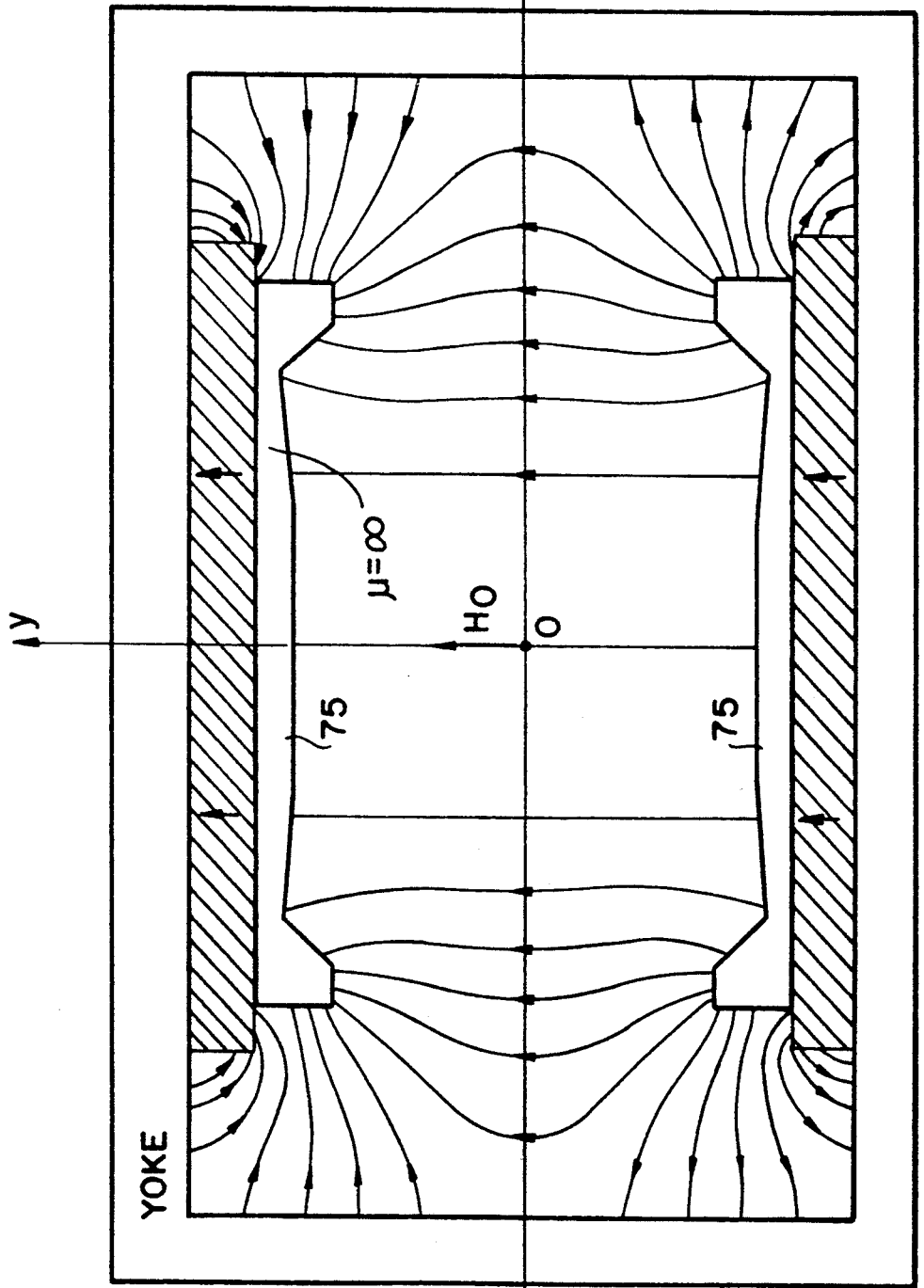
FIG. 11 is a cross sectional diagram illustrating a conventional permanent magnet structure.

The effect of the arrangement of the invention as illustrated in FIGS. 8 and 10, is compared with a conventional magnet as illustrated in FIG. 11. FIG. 11 is a cross sectional view of a conventional axisymmetric magnet with a closed cylindrical yoke, designed to generate a uniform field in a region of the gap about its center. The $\mu = \infty$ components 50 that interface with the cavity 15 of the structure of FIG. 10 occupy a position that is similar to that of the pole pieces 75 of the structure of FIG. 11. The essential difference lies in the fact that in the arrangement of the invention, as illustrated in FIG. 10, the magnetic material is a closed structure that totally encloses the cavity 15 of the magnet, while in the conventional arrangement of FIG. 11 there is no physical separation of the cavity from the yoke. The removal of the $\mu = \infty$ components 50 in FIG. 10 would have no effect on the basic field configuration because as stated above, their only function is to act as shields or filters of field perturbation. The field uniformity and the flux confinement within the region of interest is the consequence of the closed structure of the magnetic material of FIG. 10. These two functions cannot be accomplished in the structure of FIG. 11, since the field configuration in this arrangement is controlled by the geometry of the pole pieces, and the fringe field region is the consequence of the open geometry of the magnet cavity.

The closed magnetic structure of FIG. 10 eliminates the fringe field area of the conventional magnet of FIG. 11 where a large fraction of the total flux generated by the magnetic material is wasted in the volume outside of the region of interest. In addition, in the structure of FIG. 10 the region of field uniformity is the full volume of the prismatic cavity, while in the conventional magnet, the field uniformity with the region of interest is achieved at the cost of a larger volume of the region between the pole pieces.

The maximum value of the figure of merit provided by the equation $M = K(1-K)$ at $K - 0.5$ is $$M_{max} = 0.25 \tag{21}$$

$M_{max}$ is the standard that can be used to judge the quality of a magnet design. In the ideal case of a linear demagnetization characteristic, the optimum value $K=0.5$ is the operating point that corresponds to the maximum of the energy product curve. The equation $$M = \frac{K(1-K)}{1 + \frac{y_0}{2x_0} \frac{1}{(\sqrt{(1-K)^3(1+K)}) + (\sqrt{K^3(2-K)})}} \tag{22}$$

gives a value of the figure of merit of the two-dimensional structure of FIG. 10 as:

$$M \approx 0.13 \tag{23}$$

In the three-dimensional structure of FIG. 13, with cavity dimensions $$\frac{x_0}{y_0} = \frac{z_0}{y_0} = 1.5 \tag{24}$$

the figure of merit reduces to $$M \approx 0.1 \tag{25}$$

at $K = 0.25$.

In the conventional magnet of FIG. 7 the magnetic material also operates at the peak of the energy product, and the geometry of the structure is designed to generate the selected value of parameter K with the region of interest. In the particular case of FIG. 7, the nominal value of K is approximately equal to the value $K = 0.25$ of the schematic of FIG. 10, and the linear dimensions of the region of interest where the magnetic field satisfies the uniformity requirement, are approximately one half the dimensions of the gap. This is due to the open geometry of the gap region. This results in a figure of merit of the magnet of FIG. 7

$$M \approx 0.025$$

which is substantially lower than the value $M \approx 0.1$. The volume of magnetic material of the magnet of FIG. 7 is smaller than the volume of the closed structure of FIG. 3. However the volume of uniform field in FIG. 7 is only a fraction of the volume of the cavity of FIG. 3.

Thus the closing of the region of interest, even with the same high energy product material used to generate the field within the cavity, results in a smaller and more efficient magnet.

In a practical magnet, the closed magnetic structure of FIG. 3 must be partially open to the external medium. The opening introduces a decrease of the intensity, as well as a distortion of the field within the cavity, that can be partially compensated by the techniques discussed in Generation of a Uniform Field in a Yokeless Permanent Magnet For NMR Clinical Applications, M. G. Abele, T.R.-19, New York University, N.Y., Jul. 1, 1988.

On many occasions it is desirable to provide a magnetic structure having a cavity extending along a Z axis of the structure, being fully enclosed on its sides, but having an open end for receiving objects. In such an arrangement, it is well known that the field in the center of the cavity is not homogeneous unless the length of the structure is very large as compared with its transverse dimensions. For example, in some applications it is necessary to maintain the homogeneity of the field, in the region of interest, within between one to ten parts per million. In the past, a finite length of the field was compensated in a region of interest by providing a series of transverse cuts in the core of the magnetized material. In addition to the complexity of determining the locations, sizes, etc., of such cuts, the cuts greatly increased the inhomogeneity of the field immediately outside of the compensated region, and also decreases the strength of the field in the region of interest. At any rate, the solution was not available for use in magnetic structures wherein the length of the core was not significantly greater than the transverse dimensions thereof (e.g. at least 3 to 4 times the transverse dimensions of the core).

Figure 16:
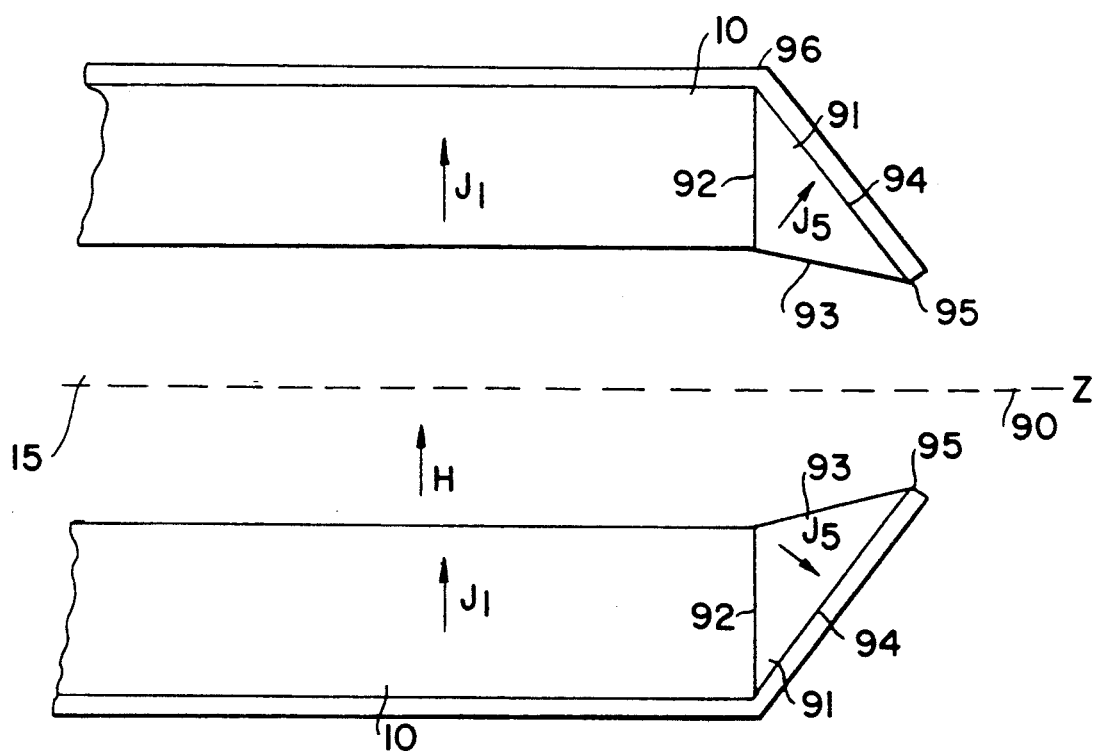
FIG. 16 is a simplified cross sectional view of a two dimensional magnetic structure in accordance with a further embodiment of the invention, showing the open end of the magnet.

Referring now to FIG. 16, which depicts in a simple manner the details of a magnetic structure close to an open end of a magnet of the type illustrated in FIG. 1, having a cavity 15 extending along the Z axis 90, it has been found that significant improvement can be obtained in the homogeneity of the field in the cavity by providing triangular cross section magnetized elements 91 abutting the end of each of the elements 10 of magnetic material, e.g. the same material as the elements 10, along the end surfaces 92 thereof. The triangular elements 91 have sides 93 toward the Z axis 90, and sides 94 away from the Z axis 90. The sides 93, 94 join one another along junctions 95, the edges being closer to the Z axis than the magnetic elements 10.

In this arrangement, it is apparent that the angle of vliew from a point on the Z axis within the cavity defined by the end opening at the ends of the magnetic structure has been reduced, to further enhance the homogeneity of the field in the cavity.

The triangular elements 91 are of magnetized material, and have magnetizations $J_5$ perpendicular to their sides 94, with the magnitude of the magnetizations $J_5$ determined by a vector diagram in accordance with FIG. 2. Therefore the magnitude of $J_5$ is equal and opposite to the magnetic field within the triangular cross section elements 91.

The entire outside surface of the magnetic structure is equipotental at zero potential, and may be covered with a magnetic yoke 96.

Figure 17:
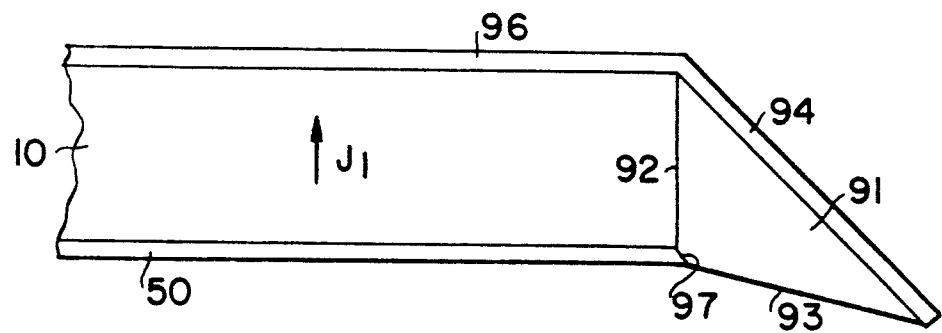
FIG. 17 is a view of a portion of a modification of the structure of FIG. 16.

In a modification of the structure of FIG. 16, when a layer 50 of high permeability material 50 is provided on the inner surfaces of the elements 10, as seen in FIG. 17, the inner edge of the side 92 extend to the inner edge of the member 10, as in the arrangement of FIG. 16. In this case, however, a surface 97 is provided between the ends of the sides 92 and 93 of the triangular cross section element 91, the surface 97 extending parallel to the outer side 94 of the triangular cross section element. The outer end of the layer 50 of high permeability material extends at an acute angle to the inner surface of the member 10, to fully abut the surface 97, as illustrated.

Figure 18:
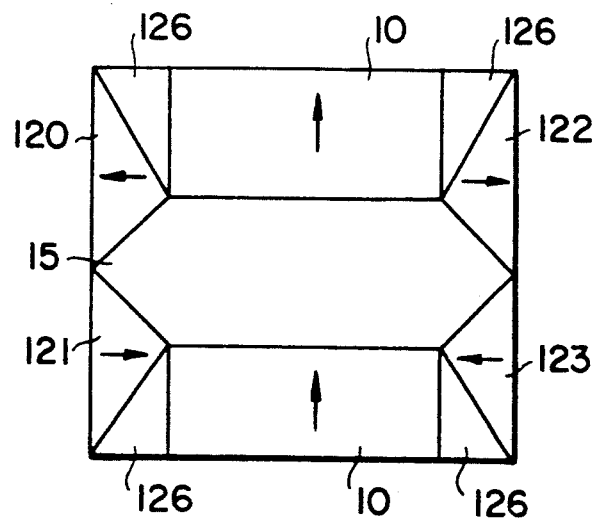
FIG. 18 is an end view of a known magnetic structure with a hexagonal cross section cavity.
Figure 19:
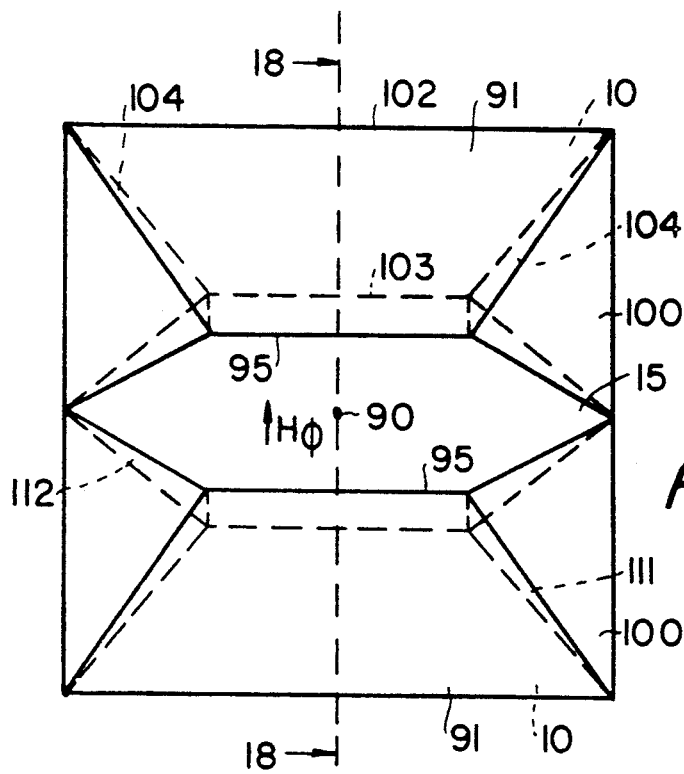
FIG. 19 is a end view of a three dimensional magnetic structure in accordance with FIG. 16.
Figure 20:
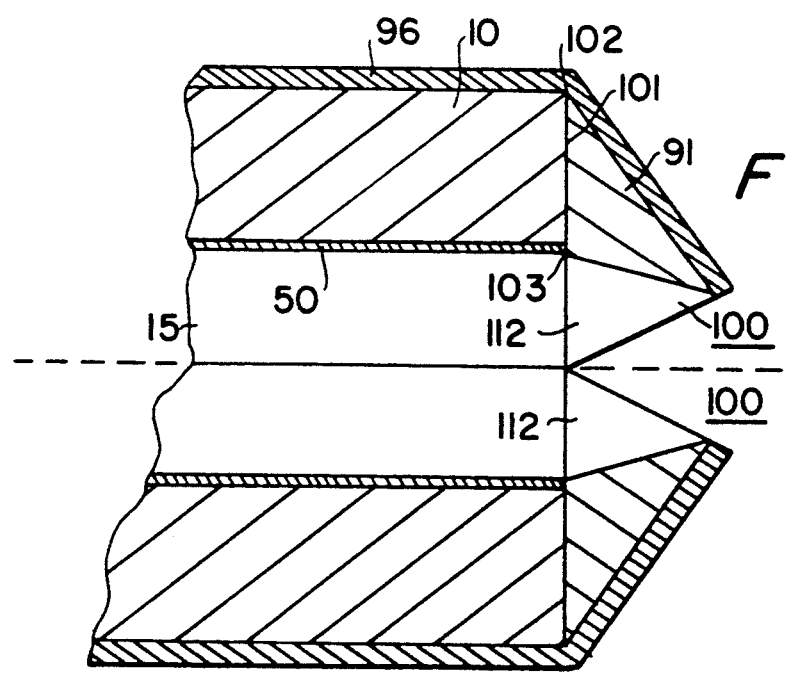
FIG. 20 is a cross sectional view of a portion of the three dimensional magnetic structure taken along the lines 18—18 of FIG. 17.

FIG. 19 and 20 are an end view and a longitudinal cross sectional view, respectively, of a magnetic structure in accordance with FIG. 16, positioned on a magnetic structure, which may be of known configuration, having a hexagonal cross section cavity 15. FIG. 18 is an end view of such a known magnetic structure. As illustrated, the upper and lower sides of the cavity are defined by the magnetized members 10, and magnetized triangular cross section members 120, 121, 122 and 123 have inner surfaces defining the remainder of the sides of the cavity. The outer periphery of this structure may be rectangular, as illustrated, with air or material of similar magnetic characteristics being provided in the triangular cross section regions 126 between the members 10 and the adjacent members 121-123. In order to simplify the following description of the structure, reference to the ends of the elements 10 will be considered to include also the adjacent ends of the regions 126.

Figure 21:
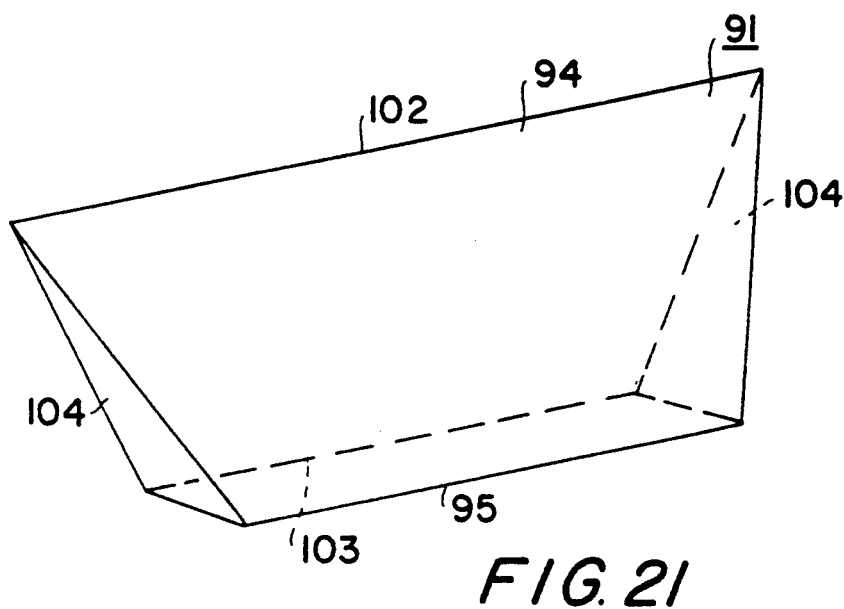
FIG. 21 is a perspective view of the magnetic element 91 of FIG. 17.

The arrangement of FIGS. 19 and 20 is thus adapted to be positioned on the end of a core of a magnetic structure such as illustrated in FIG. 18. In this arrangement, the sides 101 of the elements 91 with triangular cross sections abut the ends of the magnetic elements 10 and are generally trapezoidal (see FIG. 21), having long edges 102 abutting the outer transverse edges of the magnetic elements 10 and shorter parallel edges 103 abutting the inner edges of the magnetic elements 10 adjacent the cavity. The edges 95 of the elements 91 have the same length as the edges 103. Accordingly, the triangular faces 104 of the elements 91 extend in planes that are at non-right angles to the edges 95 and 102.

Figure 22:
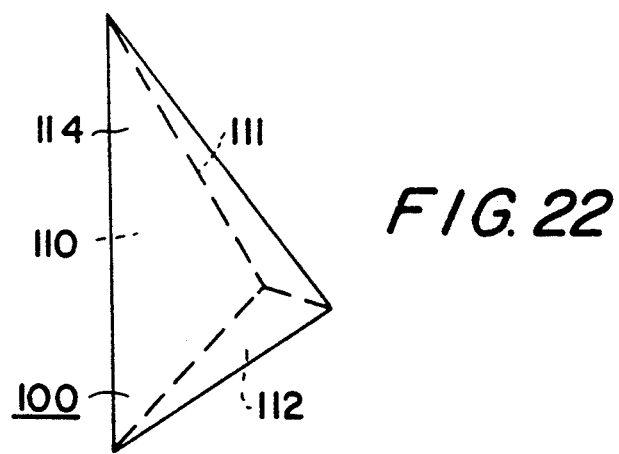
FIG. 22 is a perspective view of the magnetic element 10 of FIG. 17.

As further illustrated in FIG. 19, triangular pyramidal magnetized magnetic elements 100 are provided at the end of the cavity and having bases 110 (see FIG. 22) abutting separate ones of the magnetized elements 120, 121, 122, 123 without overlapping the cavity. These magnetic elements have triangular surfaces 111 of the same shape as the sides 104 of the elements 91 that abut the sides 104. The elements 100 have inner triangular sides 112 facing the cavity 15 and outer triangular sides 114. The elements 100 have magnetizations extending perpendicular to the sides 114 thereof, the magnitudes of the magnetizations being determined by a vector diagram in accordance with FIG. 2.

Figure 23:
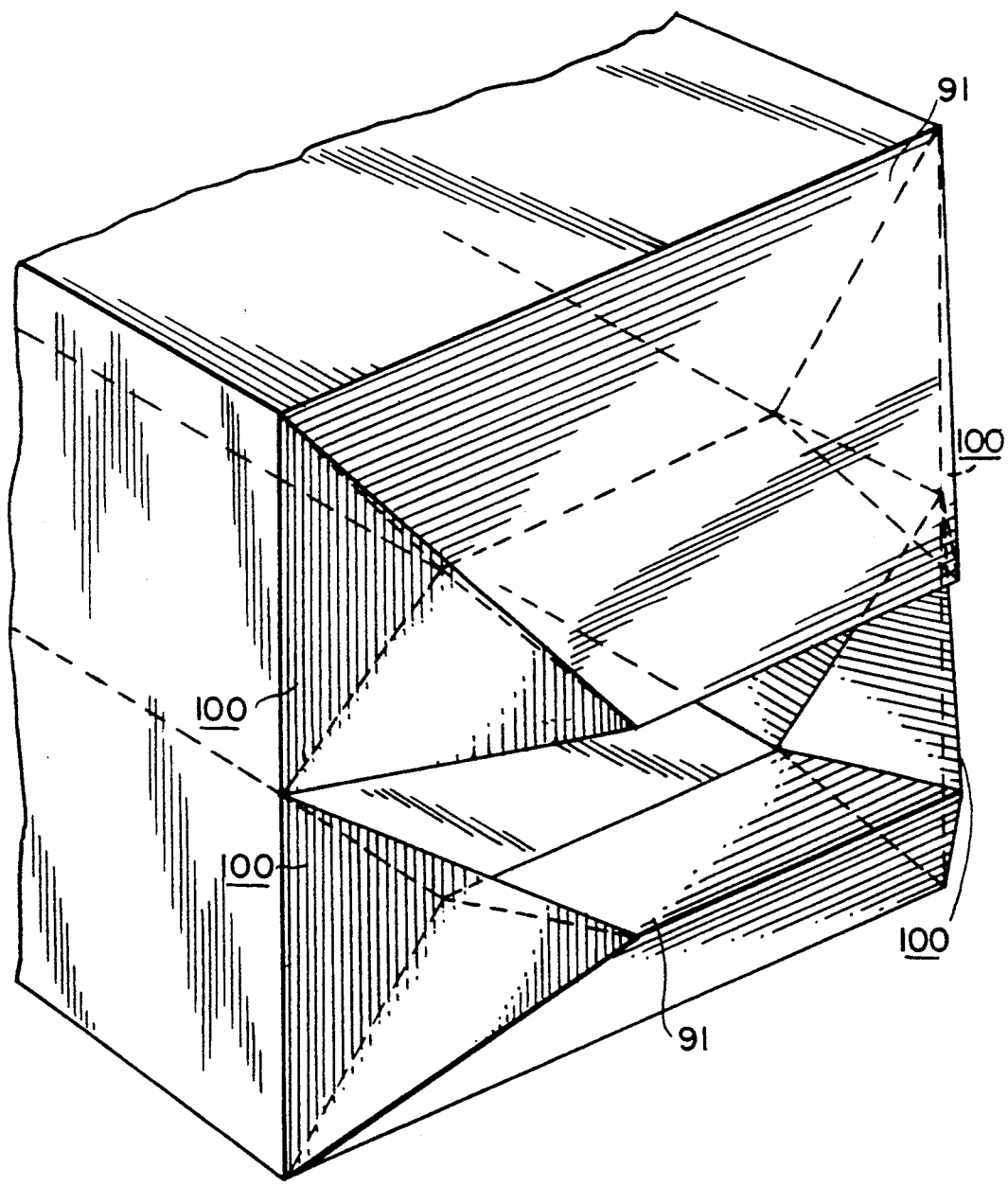
FIG. 23 is a perspective view of the end of a magnetic structure in accordance with FIGS. 17-20.

FIG. 23 illustrates a perspective view of an end of a magnetic structure in accordance with FIGS. 16-20, in order to enable a clearer appreciation of the invention.

While the invention has been disclosed and described with reference to a limited number of embodiments, it will be apparent that variations and modifications may be made therein, and it is therefore intended in the following claims to cover each such variation and modification as falls within the true spirit and scope of the invention.

What is claimed is:

1. A yoked magnetic structure having a pair of spaced magnetized members defining a cavity, and comprising at least a first element of triangular cross section having one side abutting an end of one of said magnetized members and a second element of triangular cross section having one side abutting the adjacent side of said cavity, and a yoke at least partially enclosing both of said magnetized members and the first and second elements, said first and second elements having second sides away from said magnetized member and cavity, said first and second elements having magnetization amplitudes and directions to establish equipotential lines at said second sides of said elements that define at least part of an equipotential line independently of said yoke, whereby the flux density on the side of said equipotential line away from said magnetized structure is zero.

2. The yoked magnetic structure of claim 1 wherein a side of said second element abuts a side of said first element along an interface line.

3. The yoked magnetic structure of claim 1 wherein said yoke is a passive structure comprised of ferro magnetic material.

4. The yoked magnetic structure of claim 1 wherein said yoke is an active structure comprised of magentized material.

5. The yoked magnetic structure of claim 1 wherein said yoke extends around and abuts said first and second elements.

6. The yoked magnetic structure of claim 1 wherein said yoke extends around and is spaced from said first and second elements, thereby defining a region between said yoke and first and second elements having a constant zero potential and flux density of zero.

7. The yoked magnetic structure of claim 1 further comprising a layer of constant thickness of a high permeability ferromagnetic material defining an interface between each magnetized member and said cavity.

8. The yoked magnetic structure of claim 2 wherein said spaced magnetized members have a magnetization $J_1$ and the direction of said interface line is defined by a vector diagram having first and second lines parallel to the interface of said cavity and a magnetized member, a third line extending perpendicularly between said parallel lines and having a length proportional to $J_1$, and a point on said third line spaced from said first line a distance proportional to $\mu_0 H_0$, a fourth line extending between said point and said first line and having a length proportional to $J_2$, and a fifth line extending between said point and said second line and having a length proportional to $J_3$, said fourth and fifth lines defining diameters of a pair of circles, said interface line extending in a direction parallel to a sixth line between said point and the intersection of said circles, wherein $J_2$ and $J_3$ are magnetizations of said first and second elements and $H_0$ is the field in said cavity.

9. A yoked magnetic structure having a pair of parallel spaced magnetized members having a magnetization $J_1$ and defining a cavity therebetween, said cavity having an equatorial plane between said magnetized members, first and second magnetized elements having triangular cross sections and having magnetizations $J_2$ and $J_3$ respectively, said first and second elements having colinear first sides abutting an end of one of said magnetized members and extending from said one magnetized member to said equatorial plane, respectively, and a yoke at least partially surrounding said magnetic structure, said first and second elements having second sides away from said magnetized member and cavity, the magnetization amplitude and direction of said first and second magnetized elements defining at least part of an equipotential line at said first and second sides, in the absence of said yoke, whereby the flux density on the side of said equipotential line away from said magnetized structure is zero.

10. The yoked magnetic structure of claim 9 wherein said magnetized elements have third sides that abut one another to define an interface line.

11. The yoked magnetic structure of claim 9 wherein $J_1 = J_2 = J_3$.

12. The yoked magnetic structure of claim 9 wherein:

$$J_2 \geq (1-K)J_1$$

and $$J_3 \geq KJ_1$$

wherein $$K = \mu_0 \frac{H_0}{J_1}$$

and $H_0$ is the field in said cavity and $\mu_0$ is the permability of a vacuum.

13. The yoked magnetic structure of claim 9 further comprising a layer of uniform thickness of material having a high permeability defining an interface between said cavity and said one magnetized member.

14. The yoked magnetic structure of claim 10 wherein said interface line extends parallel to a vector defined by a vector diagram having first and second parallel lines spaced apart and perpendicular to opposite ends of a third line having a length proportional to $J_1$, a point on said third line being spaced from said first line a distance proportional to $\mu_0 H_0$, wherein $\mu_0$ is the permeability of a vacuum and $H_0$ is the field in said cavity, a first circle having a diameter line proportional to $J_3$ that extends between said point and said first line, a second circle having a diameter line proportional to $J_2$ that extends between said point and said second line, said fourth line extending between said point and the intersection of said first and second circles.

15. A yoked magnetic structure having a magnetized member extending along and spaced from a longitudinal axis and defining a part of a cavity, and an end yoked magnetic structure abutting an end of said magnetized member, said end structure comprising a triangular cross section magnetized element having a first side abutting an end of said magnetized member, said triangular cross section element having an edge opposite to said first side that is closer to said longitudinal axis than said magnetized member, said cavity being open between said opposite edge and said longitudinal axis, said triangular cross section element having a side away from said axis that defines at least part of an equipotential line whereby the flux density on the side of said equipotential line away from said magnetized structure is substantially zero.

16. A yoked magnetic structure having a pair of parallel spaced magnetized members extending along and spaced from a longitudinal axis and defining a cavity, and an end yoked magnetic structure abutting an end of said magnetized members, said end structure comprising a triangular cross section magnetized element having a first side abutting an end of one of said magnetized members, said triangular cross section element having an edge opposite to said first side that is closer to said longitudinal axis than said spaced magnetized members, said cavity being open between said opposite edge and said longitudinal axis, said triangular cross section element having a side away from said axis that defines at least part of an equipotential line whereby the flux density on the side of said equipotential line away from said magnetized structure is substantially zero.

17. The yoked magnetic structure of claim 16 wherein said triangular cross section element has ends that are in planes at acute angles to the longitudinal axis of the element, whereby at least two sides of said element are trapezoidal in shape.

18. The yoked magnetic structure of claim 17 further comprising separate triangular pyramidal elements of magnetized material having sides abutting said ends of said triangular cross section element.

* * * * *